(12) United States Patent
Jang

(10) Patent No.: US 11,824,051 B2
(45) Date of Patent: Nov. 21, 2023

(54) DISPLAY DEVICE AND TILED DISPLAY DEVICE INCLUDING THE SAME

(71) Applicant: Samsung Display Co., LTD., Yongin-si (KR)

(72) Inventor: Dae Hwan Jang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 247 days.

(21) Appl. No.: 17/323,648

(22) Filed: May 18, 2021

(65) Prior Publication Data

US 2022/0005796 A1    Jan. 6, 2022

(30) Foreign Application Priority Data

Jul. 3, 2020   (KR) ................. 10-2020-0082331

(51) Int. Cl.
| | |
|---|---|
| H01L 27/14 | (2006.01) |
| H01L 25/16 | (2023.01) |
| H01L 33/62 | (2010.01) |
| H01L 27/12 | (2006.01) |
| H01L 23/00 | (2006.01) |

(52) U.S. Cl.
CPC .......... *H01L 25/167* (2013.01); *H01L 25/162* (2013.01); *H01L 27/124* (2013.01); *H01L 27/1259* (2013.01); *H01L 33/62* (2013.01); *H01L 24/32* (2013.01); *H01L 2224/32225* (2013.01); *H01L 2933/0066* (2013.01)

(58) Field of Classification Search
CPC ... H01L 25/167; H01L 25/162; H01L 27/124; H01L 27/1259; H01L 33/62; H01L 24/32; H01L 2224/32225; H01L 2933/0066; H01L 33/18; H01L 51/5253; H01L 51/5246; H01L 51/5271; H01L 27/3293; G09G 3/32; G09G 3/3208; H10K 59/18; H10K 50/8426; H10K 50/844; H10K 50/856

USPC ..................................... 257/59, 72
See application file for complete search history.

(56) References Cited

U.S. PATENT DOCUMENTS 9,501,165 B2 * 11/2016 Kim .................. G06F 3/04164
9,530,826 B2 * 12/2016 Kwon ................ H10K 77/111

FOREIGN PATENT DOCUMENTS

| JP | 11-212079 | 8/1999 |
|---|---|---|
| KR | 10-2018-0079079 | 7/2018 |
| KR | 10-2019-0072196 | 6/2019 |
| KR | 10-2019-0115160 | 10/2019 |

* cited by examiner

*Primary Examiner* — Tan N Tran
(74) *Attorney, Agent, or Firm* — KILE PARK REED & HOUTTEMAN PLLC

(57) ABSTRACT

A display device comprises a substrate including emission areas, and light blocking areas adjacent to the emission areas, a thin film transistor layer comprising a thin film transistor disposed on the substrate, and a connection line electrically connected to the thin film transistor, a light emitting element layer disposed on the thin film transistor layer and comprising light emitting elements corresponding to the emission areas, an encapsulation layer overlapping the light emitting element layer, and a pad portion disposed on the encapsulation layer and in electrical contact with the connection line through a contact hole in the encapsulation layer.

20 Claims, 18 Drawing Sheets

DISPLAY DEVICE AND TILED DISPLAY DEVICE INCLUDING THE SAME

CROSS-REFERENCE TO RELATED APPLICATION(S)

This application claims priority to and benefits of Korean Patent Application No. 10-2020-0082331 under 35 U.S.C. § 119, filed on Jul. 3, 2020 in the Korean Intellectual Property Office, the entire disclosure of which is incorporated herein by reference.

BACKGROUND

1. Technical Field

The present disclosure relates to a display device and a tiled display device including the same.

2. Description of the Related Art

With the advance of information-oriented society, more and more demands are placed on display devices for displaying images in various ways. For example, display devices may be employed in various electronic devices such as smartphones, digital cameras, laptop computers, navigation devices, and smart televisions. A display device may be a flat panel display device such as a liquid crystal display device, a field emission display device and an organic light emitting display device. Among the flat panel display devices, in the light emitting display device, since each of the pixels of a display panel includes a light emitting element capable of emitting light by itself, an image can be displayed without a backlight unit providing light to the display panel.

In case that the display device may be manufactured in a large size, a defect rate of the light emitting element may increase due to an increase in the number of pixels, thereby deteriorating productivity or reliability of the display device. To solve this problem, in a tiled display device, a large-sized screen may be implemented by connecting multiple display devices having a relatively small size. The tiled display device may include a boundary portion called a seam between the display devices, due to a non-display area or a bezel area of each of the display devices adjacent to each other. In case that a single image may be displayed on the entire screen, the boundary portion between the display devices may give a sense of disconnection over the entire screen, thereby reducing a sense of immersion in the image.

SUMMARY

Aspects of the present disclosure may provide a tiled display device capable of removing a sense of disconnection between multiple display devices and improving a sense of immersion in an image, by preventing the recognition of boundary portions or non-display areas between the display devices.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the present disclosure, a display device may comprise a substrate including emission areas, and light blocking areas adjacent to the emission areas, a thin film transistor layer comprising a thin film transistor disposed on the substrate, and a connection line electrically connected to the thin film transistor, a light emitting element layer disposed on the thin film transistor layer and comprising light emitting elements corresponding to the emission areas, an encapsulation layer overlapping the light emitting element layer, and a pad portion disposed on the encapsulation layer and in electrical contact with the connection line through a contact hole in the encapsulation layer.

The thin film transistor layer may comprise a connection electrode disposed on the thin film transistor to electrically connect a first electrode of the thin film transistor to the light emitting element, and the connection line and the connection electrode may be disposed on a same layer.

The connection line and a gate electrode of the thin film transistor may be disposed on a same layer as.

At least one of the pad portion and the connection line may overlap the light blocking areas.

The display device may further comprise a metal layer disposed on the encapsulation layer and spaced apart from the pad portion.

The metal layer and the pad portion may include a same material.

The display device may further comprise a protective film overlapping the metal layer, and a flexible film disposed on the pad portion and electrically connected to the pad portion.

Each of the light emitting elements may comprise a first electrode disposed on the thin film transistor layer and electrically connected to the thin film transistor, a second electrode disposed on the thin film transistor layer to be spaced apart from the first electrode, and a light emitting diode disposed between the first electrode and the second electrode.

The light emitting element layer may comprise a first contact electrode overlapping an end of the light emitting diode and the first electrode to electrically connect the light emitting diode to the first electrode, and a second contact electrode overlapping another end of the light emitting diode and the second electrode to electrically connect the light emitting diode to the second electrode.

The light emitting element layer may comprise a passivation layer overlapping the light emitting element, the first contact electrode, and the second contact electrode, and reflective members overlapping the passivation layer and reflecting light emitted from the light emitting diode toward the substrate. The reflective members of each of the emission areas may be spaced apart from each other.

The encapsulation layer may overlap top and side surfaces of each of the reflective members, and a portion of the thin film transistor layer.

The light emitting element layer may comprise a passivation layer overlapping the light emitting element, the first contact electrode, and the second contact electrode, and a reflective member overlapping the passivation layer and the thin film transistor layer, and reflecting light emitted from the light emitting diode toward the substrate.

According to an embodiment of the present disclosure, a tiled display device may comprise a plurality of display devices including a display area comprising pixels and a non-display area adjacent to the display area, and a bonding member bonding the plurality of display devices. Each of the plurality of display devices may comprise a substrate including emission areas as a part of the display area, and light blocking areas as another part of the display area, the light blocking areas adjacent to the emission areas, a thin film transistor layer comprising a thin film transistor disposed on the substrate, and a connection line electrically connected to the thin film transistor, a light emitting element layer disposed on the thin film transistor layer and comprising light emitting elements corresponding to the emission areas, an encapsulation layer overlapping the light emitting element layer, and a pad portion disposed on the encapsulation layer and in electrical contact with the connection line through a contact hole in the encapsulation layer.

The thin film transistor layer may comprise a connection electrode disposed on the thin film transistor to electrically connect a first electrode of the thin film transistor to the light emitting element, and the connection line and the connection electrode may be disposed on a same layer.

The connection line and a gate electrode of the thin film transistor may be disposed on a same layer.

At least one of the pad portion and the connection line may overlap at least one of the non-display area and the light blocking areas.

Each of the plurality of display devices may comprise a metal layer disposed on the encapsulation layer and spaced apart from the pad portion.

Each of the plurality of display devices may comprise a protective film overlapping the metal layer, and a flexible film disposed on the pad portion and electrically connected to the pad portion.

Each of the light emitting elements may comprise a first electrode, a second electrode spaced apart from the first electrode, and a light emitting diode disposed between the first electrode and the second electrode. The light emitting element layer may comprise a first contact electrode electrically connecting the light emitting diode to the first electrode, and a second contact electrode electrically connecting the light emitting diode to the second electrode.

The light emitting element layer may comprise a passivation layer overlapping the light emitting element, the first contact electrode, and the second contact electrode, and a reflective member overlapping the passivation layer and reflecting light emitted from the light emitting diode toward the substrate.

In the display device and the tiled display device including the same according to embodiments, light emitted from a light emitting element layer may be reflected by a reflective member and transmitted to the front of the display device through a substrate. A pad portion may be disposed on an encapsulation layer at the edge of the display device. Each of the plurality of display devices may include the pad portion disposed at the rear thereof, thereby minimizing a size of the non-display area of the display device. Accordingly, in the tiled display device, by minimizing the gap between the plurality of display devices, it may be possible to prevent a user from recognizing the boundary portions or the non-display areas between the plurality of display devices.

The effects of the present disclosure are not limited to the aforementioned effects, and various other effects are included in the present disclosure.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

Figure 1:
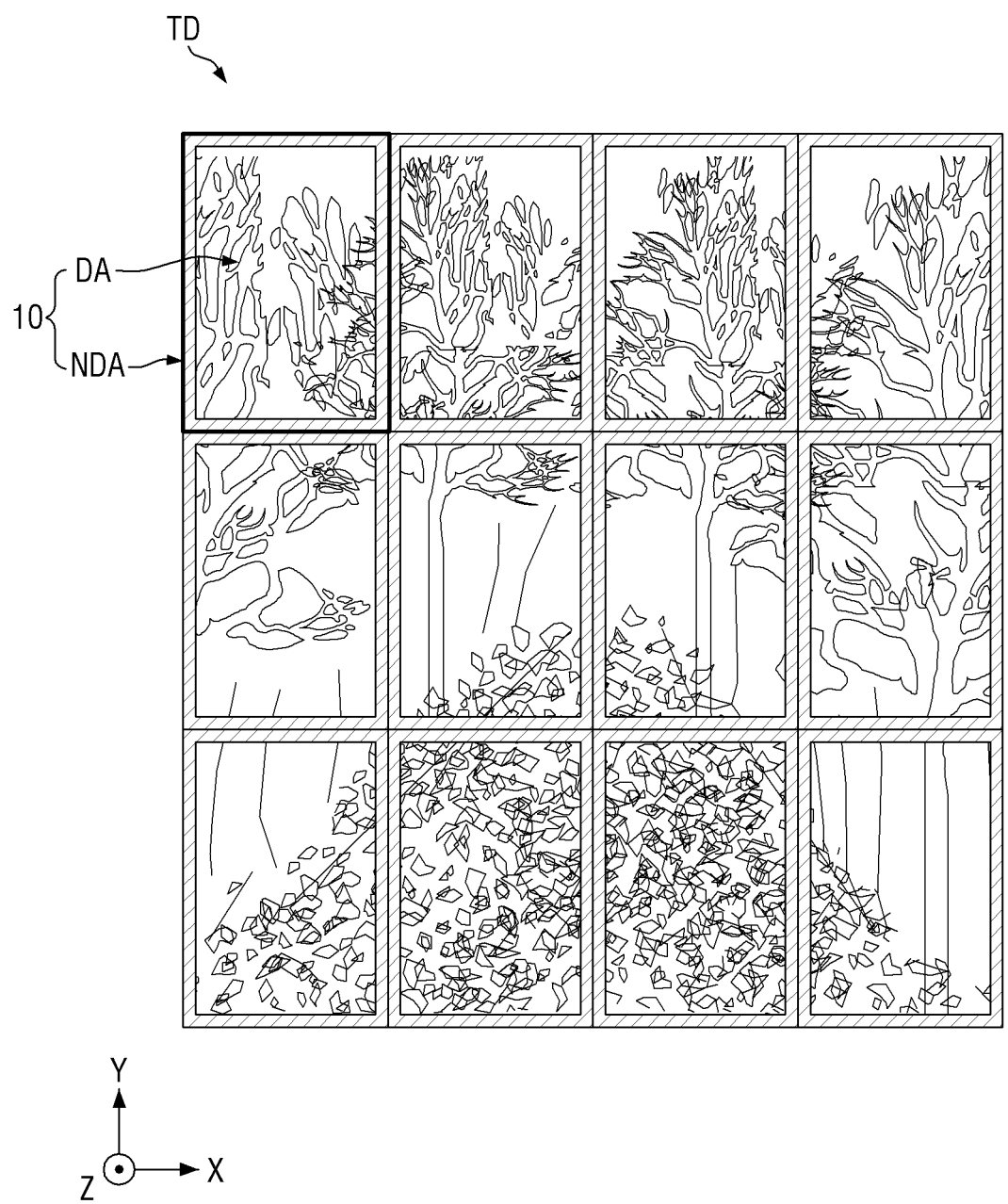
FIG. 1 is a schematic plan view illustrating a tiled display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another exemplary embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. In case that an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there may be no intervening elements or layers present. To this end, the term "connected" may refer to physical, electrical, and/or fluid connection, with or without intervening elements. Further, the X-axis, the Y-axis, and the Z-axis may not be limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure. The term "overlap" may include layer, stack, face or facing, extending over, extending under, covering or partly covering or any other suitable term as would be appreciated and understood by those of ordinary skill in the art.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "has", "having", "includes," "including," and the like, when used in this disclosure, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic plan view illustrating a tiled display device according to an embodiment.

Referring to FIG. 1, a tiled display device TD may include multiple display devices 10. The display devices 10 may be arranged in a grid form, but are not limited thereto. The display devices 10 may be connected in a first direction (X-axis direction) or a second direction (Y-axis direction), and the tiled display device TD may have a particular shape. For example, the display devices 10 may have the same size, but are not limited thereto. As another example, the display devices 10 may have different sizes.

Each of the display devices 10 may have a rectangular shape including long sides and short sides. The display devices 10 may be arranged such that the long sides or the short sides thereof may be connected to each other. Some of the display devices 10 may be disposed at the edge of the tiled display device TD to form a side of the tiled display device TD. Some others of the display devices 10 may be disposed at corners of the tiled display device TD to form two adjacent sides of the tiled display device TD. Yet some others of the display devices 10 may be disposed on the inner side of the tiled display device TD, and may be surrounded by other display devices 10.

Each of the display devices 10 may include a display area DA and a non-display area NDA. The display area DA may include pixels to display an image. The non-display area NDA may be disposed around the display area DA to surround the display area DA, and may not display an image.

The tiled display device TD may have a planar shape as a whole, but is not limited thereto. The tiled display device TD may have a three-dimensional shape to provide a three-dimensional effect to a user. For example, in case that the tiled display device TD has a three-dimensional shape, at least some of the display devices 10 may have a curved shape. As another example, the display devices 10 may each have a planar shape and may be connected to each other at an angle, so that the tiled display device TD may have a three-dimensional shape.

The tiled display device TD may be formed by connecting the non-display areas NDA of the adjacent display devices 10. The display devices 10 may be connected to each other through a bonding member or an adhesive member. Accordingly, the non-display areas NDA between the display devices 10 may be surrounded by the adjacent display areas DA. The distance between the display areas DA of the display devices 10 may be small enough that the non-display areas NDA between the display devices 10 or the boundary portions between the display devices 10 may not be recognized by the user. The reflectance of external light of the display areas DA of display devices 10 may be substantially the same as that of the non-display areas NDA between the multiple display devices 10. Accordingly, in the tiled display device TD, the boundary portions or the non-display areas NDA between the display devices 10 may be prevented from being recognized, thereby removing a sense of disconnection between the display devices 10 and improving a sense of immersion in an image.

Figure 2:
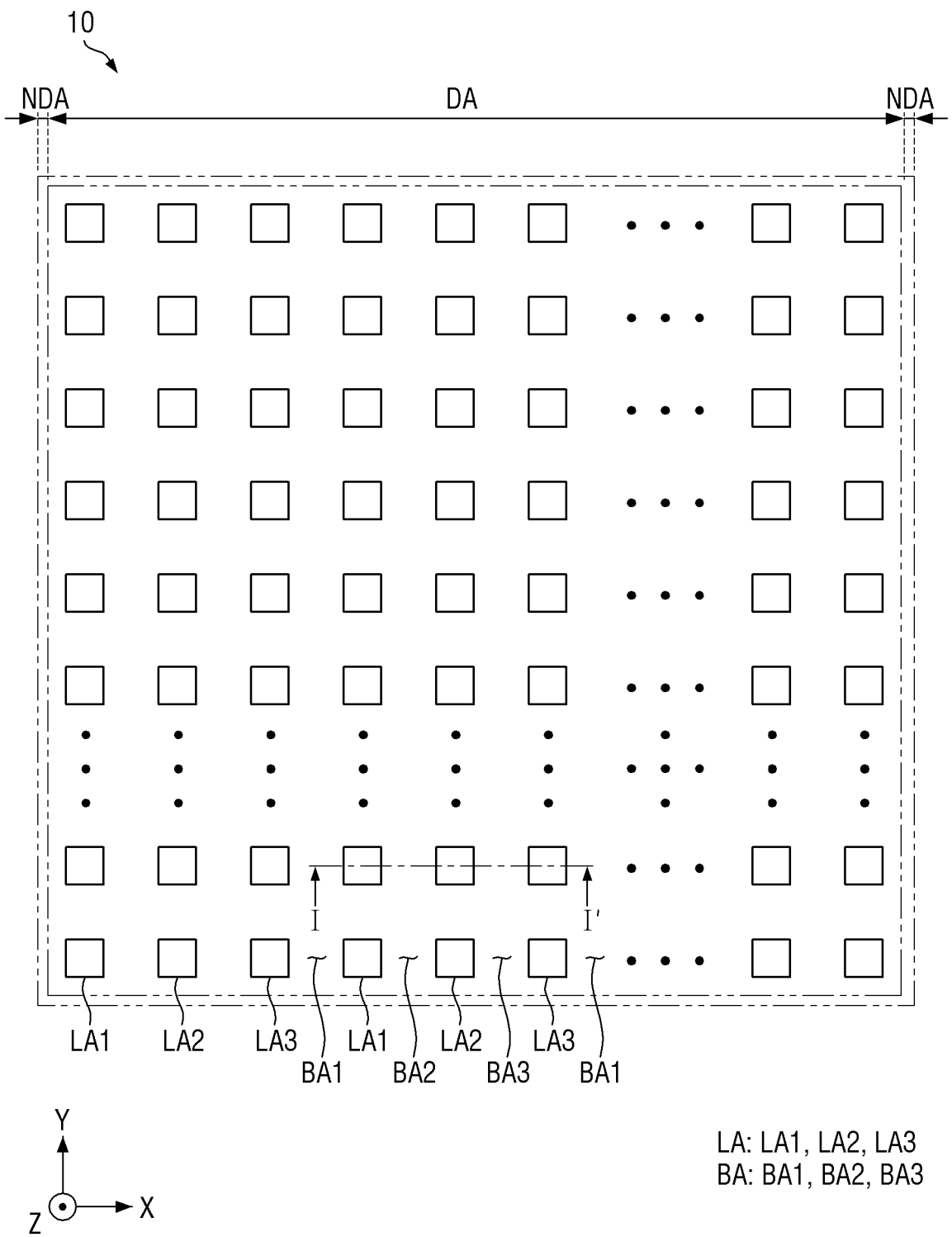
FIG. 2 is a schematic plan view illustrating a display device according to an embodiment.

FIG. 2 is a schematic plan view illustrating a display device according to an embodiment.

Referring to FIG. 2, the display device 10 may include pixels arranged along rows and columns in the display area DA. Each of the pixels may include an emission area LA defined by a pixel defining layer, and may emit light having a peak wavelength through the emission area LA. For example, the display area DA of the display device 10 may include first to third emission areas LA1, LA2, and LA3. Each of the first to third emission areas LA1, LA2, and LA3 may be an area in which light generated from a light emitting element of the display device 10 may be emitted to the outside of the display device 10.

The first to third emission areas LA1, LA2, and LA3 may emit light having a peak wavelength to the outside of the display device 10. The first emission area LA1 may emit light of a first color, the second emission area LA2 may emit light of a second color, and the third emission area LA3 may emit light of a third color. For example, the first color light may be red light having a peak wavelength in the range from about 610 nm to about 650 nm, the second color light may be green light having a peak wavelength in the range from about 510 nm to about 550 nm, and the third color light may be blue light having a peak wavelength in the range from about 440 nm to about 480 nm, but the present disclosure is not limited thereto.

The first to third emission areas LA1, LA2, and LA3 may be arranged in order repetitively in the first direction (X-axis direction) in the display area DA. In an example, the width of the first emission area LA1 in the first direction (X-axis direction) may be larger than the width of the second emission area LA2 in the first direction, and the width of the second emission area LA2 in the first direction may be larger than the width of the third emission area LA3 in the first direction. As another example, the width of the first emission area LA1 in the first direction (X-axis direction), the width of the second emission area LA2 in the first direction, and the width of the third emission area LA3 in the first direction may be substantially the same.

In an example, the first emission area LA1 may be larger in size than the second emission area LA2, and the second emission area LA2 may be larger in size than the third emission area LA3. As another example, the first emission area LA1, the second emission area LA2, and the third emission area LA3 may be substantially the same in size.

The display area DA of the display device 10 may include light blocking areas BA that surround the emission areas LA. For example, the display area DA may include first to third light blocking areas BA1, BA2, and BA3. The first to third light blocking areas BA1, BA2, and BA3 may be disposed at a side of the first to third emission areas LA1, LA2, and LA3, respectively, to prevent the colored lights emitted through the first to third emission areas LA1, LA2, and LA3 from mixing with each other.

Figure 3:
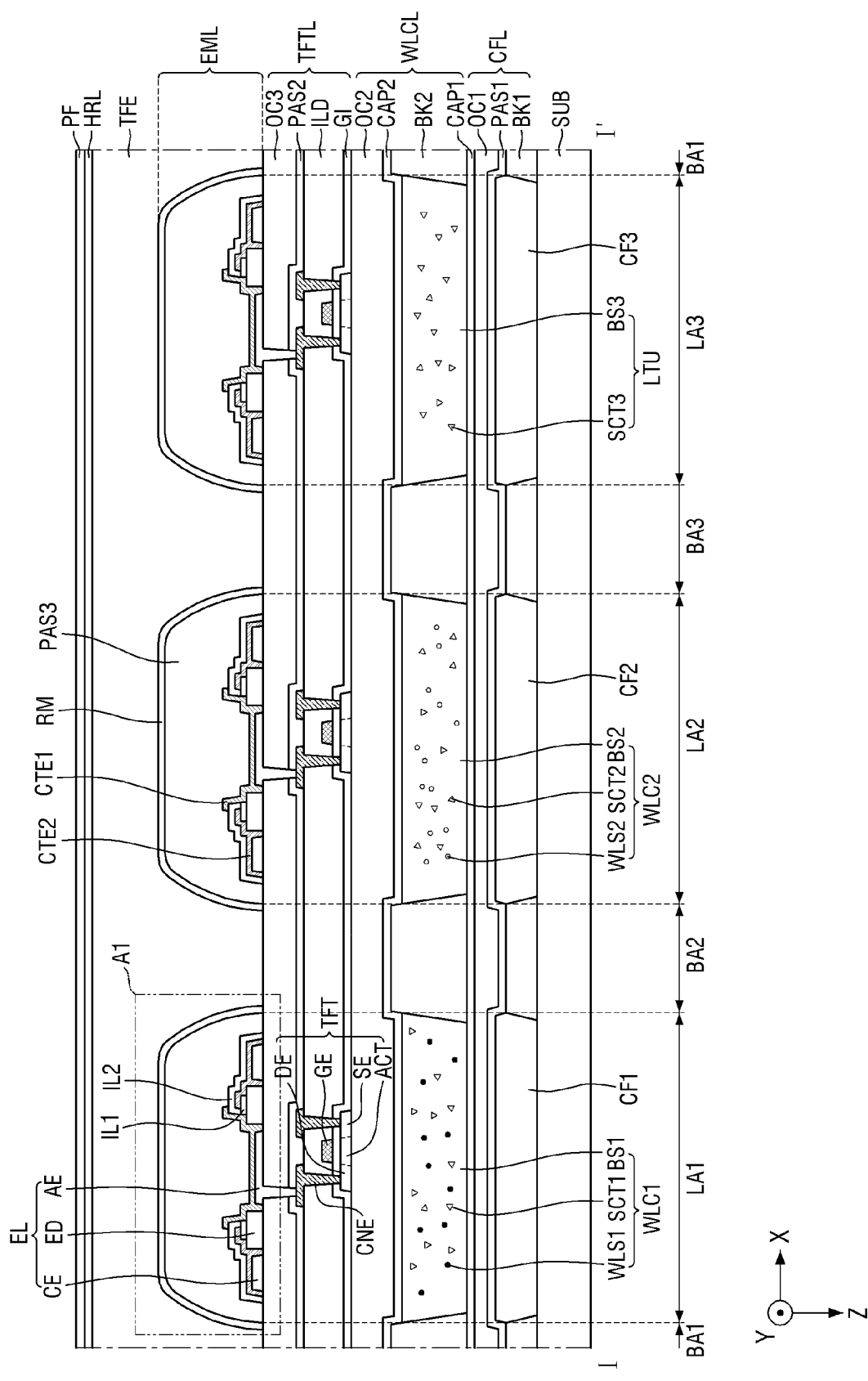
FIG. 3 is a schematic cross-sectional view taken along line I-I' of FIG. 2.
Figure 4:
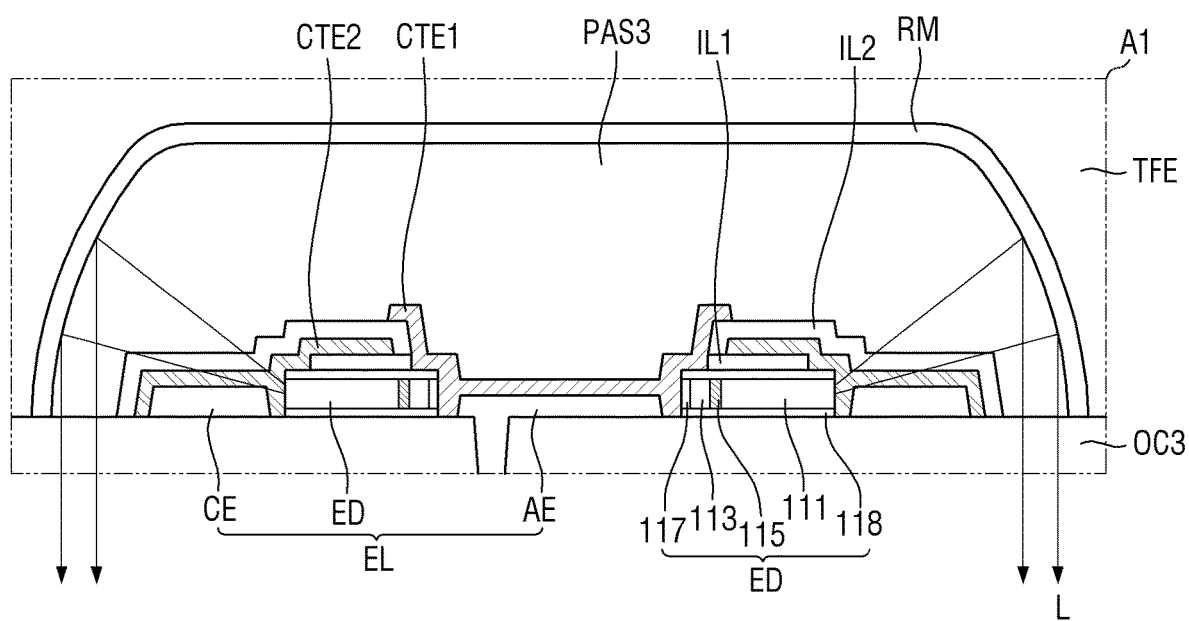
FIG. 4 is an enlarged schematic view of area A1 of FIG. 3.

FIG. 3 is a cross-sectional view taken along line I-I' of FIG. 2. FIG. 4 is an enlarged schematic view of area A1 of FIG. 3.

Referring to FIGS. 3 and 4, the display area DA of the display device 10 may include first to third emission areas LA1, LA2, and LA3. Each of the first to third emission areas LA1, LA2, and LA3 may be an area in which light generated from a light emitting diode ED (see, e.g., FIG. 5) of the display device 10 may be emitted to the outside of the display device 10.

The display device 10 may include a substrate SUB, a color filter layer CFL, a wavelength conversion layer WLCL, a thin film transistor layer TFTL, a light emitting element layer EML, an encapsulation layer TFE, a metal layer HRL, and a protective film PF.

The substrate SUB may be a base substrate or a base member, and may be made of an insulating material such as a polymer resin. For example, the substrate SUB may be a flexible substrate which can be bent, folded and rolled. The substrate SUB may include polyimide (PI), but is not limited thereto.

The color filter layer CFL may include a first light blocking member BK1, first to third color filters CF1, CF2, and CF3, and a first planarization layer OC1.

The first light blocking member BK1 may be disposed on the substrate SUB in the first to third light blocking areas BA1, BA2, and BA3. The first light blocking member BK1 may overlap the second light blocking member BK2 in the thickness direction. The first light blocking member BK1 may block transmission of light. The first light blocking member BK1 may prevent light infiltration and color mixture between the first to third emission areas LA1, LA2, and LA3, which leads to the improvement of color reproducibility. The first light blocking member BK1 may be arranged in the form of a grid surrounding the first to third emission areas LA1, LA2, and LA3 in plan view.

The first color filter CF1 may be disposed in the first emission area LA1 on the substrate SUB. The first color filter CF1 may be surrounded by the first light blocking member BK1. The first color filter CF1 may overlap a first wavelength conversion portion WLC1 in the thickness direction. The first color filter CF1 may selectively allow the first color light (e.g., red light) to pass therethrough, and filter out or absorb the second color light (e.g., green light) and the third color light (e.g., blue light). For example, the first color filter CF1 may be a red color filter and contain a red colorant. The red colorant may be a red dye or a red pigment.

The second color filter CF2 may be disposed in the second emission area LA2 on the substrate SUB. The second color filter CF2 may be surrounded by the first light blocking member BK1. The second color filter CF2 may overlap a second wavelength conversion portion WLC2 in the thickness direction. The second color filter CF2 may selectively allow the second color light (e.g., green light) to pass therethrough, and filter out or absorb the first color light (e.g., red light) and the third color light (e.g., blue light). For example, the second color filter CF2 may be a green color filter and contain a green colorant. The green colorant may be a green dye or a green pigment.

The third color filter CF3 may be disposed in the third emission area LA3 on the substrate SUB. The third color filter CF3 may be surrounded by the first light blocking member BK1. The third color filter CF3 may overlap a light transmission portion LTU in the thickness direction. The third color filter CF3 may selectively allow the third color light (e.g., blue light) to pass therethrough, and filter out or absorb the first color light (e.g., red light) and the second color light (e.g., green light). For example, the third color filter CF3 may be a blue color filter and contain a blue colorant. The blue colorant may be a blue dye or a blue pigment.

The first to third color filters CF1, CF2, and CF3 may absorb a part of the light coming from outside of the display device 10 to reduce the reflected light of the external light. This means that the first to third color filters CF1, CF2, and CF3 can prevent color distortion caused by the reflection of the external light.

Since the first to third color filters CF1, CF2, and CF3 may be disposed between the substrate SUB and the thin film transistor layer TFTL, the display device 10 may not require a separate substrate for the first to third color filters CF1, CF2, and CF3. Therefore, the thickness of the display device 10 may be relatively reduced.

A first passivation layer PAS1 may cover the first to third color filters CF1, CF2, and CF3. The first passivation layer PAS1 may protect the first to third color filters CF1, CF2, and CF3.

The first planarization layer OC1 may be provided on the first passivation layer PAS1 to flatten the top portion of the color filter layer CFL. The first planarization layer OC1 may include an organic material. For example, the first planarization layer OC1 may include at least one of an acrylic resin, an epoxy resin, a phenol resin, a polyamide resin, or a polyimide resin.

The wavelength conversion layer WLCL may include a first capping layer CAP1, the second light blocking member BK2, the first wavelength conversion portion WLC1, the second wavelength conversion portion WLC2, the light transmission portion LTU, and a second capping layer CAP2 and a second planarization layer OC2.

The first capping layer CAP1 may be disposed on the first planarization layer OC1 of the color filter layer CFL. The first capping layer CAP1 may seal the bottom surfaces of the light transmission portion LTU and the first and second wavelength conversion portions WLC1 and WLC2. The first capping layer CAP1 may contain an inorganic material. For example, the first capping layer CAP1 may contain at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The second light blocking member BK2 may be disposed in the first to third light blocking areas BA1, BA2, and BA3 on the first capping layer CAP1. The second light blocking member BK2 may overlap the first light blocking member BK1 in the thickness direction. The second light blocking member BK2 may block transmission of light. The second light blocking member BK2 may prevent light infiltration and color mixture between the first to third emission areas LA1, LA2, and LA3, which leads to the improvement of color reproducibility. The second light blocking member BK2 may be arranged in the form of a grid surrounding the first to third emission areas LA1, LA2, and LA3 in plan view.

The second light blocking member BK2 may contain an organic light blocking material and a lyophobic component. Here, the lyophobic component may be composed of fluorine-containing monomer or fluorine-containing polymer and, in detail, may include fluorine-containing aliphatic polycarbonate. For example, the second light blocking member BK2 may be made of a black organic material including the lyophobic component. The second light blocking member BK2 may be formed through a coating and exposure process of an organic light blocking material including the lyophobic component.

By including the lyophobic component, the second light blocking member BK2 may separate the first and second wavelength conversion portions WLC1 and WLC2 and the light transmission portion LTU into corresponding emission areas LA. For example, in the case of forming the first and second wavelength conversion portions WLC1 and WLC2 and the light transmission portion LTU in an inkjet manner, the ink compositions may slide on the upper surface of the second light blocking member BK2. The second light blocking member BK2 containing the lyophobic component may allow the ink composition to slide down to the corresponding emission areas LA. Therefore, the second light blocking member BK2 may prevent the ink compositions from being mixed.

The first wavelength conversion portion WLC1 may be disposed in the first emission area LA1 on the first capping layer CAP1. The first wavelength conversion portion WLC1 may be surrounded by the second light blocking member BK2. The first wavelength conversion portion WLC1 may include a first based resin BS1, a first scatterer SCT1, and a first wavelength shifter WLS1.

The first base resin BS1 may contain a material having a relatively high light transmittance. The first base resin BS1 may be composed of a transparent organic material. For example, the first base resin BS1 may contain at least one organic material of an epoxy resin, an acrylic resin, a cardo resin, or an imide resin.

The first scatterer SCT1 may have a refractive index different from that of the first base resin BS1 and form an optical interface with the first base resin BS1. For example, the first scatterer SCT1 may contain a light scattering material or light scattering particles scattering at least part of the transmitted light. For example, the first scatterer SCT1 may contain a metallic oxide such as at least one of titanium oxide ($TiO_2$), zirconium oxide ($ZrO_2$), aluminum oxide ($AL_2O_3$), indium oxide ($In_2O_3$), zinc oxide ($ZnO$), or tin oxide ($SnO_2$), or may contain organic particles such as acrylic resin and urethane resin. The first scatterer SCT1 may scatter light in random directions regardless of the incidence direction of the incident light without any substantial change of the peak wavelength of the incident light.

The first wavelength shifter WLS1 may change or shift the wavelength of the incident light to a first peak wavelength. For example, the first wavelength shifter WLS1 may convert the wavelength of the light emitted from the display device 10 to a single peak wavelength in the range from about 610 nm to about 650 nm to produce red light. The first wavelength shifter WLS1 may be a quantum dot, a quantum rod, or a fluorescent substance. The quantum dot may be a particulate material that emits light of a specific color in case that an electron transitions from a conduction band to a valence band.

For example, the quantum dot may be a semiconductor nanocrystal material. The quantum dot may have a band gap varying according to its construction and size so as to absorb light and proceed to emit the light having a unique wavelength. Examples of the semiconductor nanocrystal of the quantum dot may include a Group IV nanocrystal, a Group II-VI compound nanocrystal, a Group III-V compound nanocrystal, a Group IV-VI compound nanocrystal, and a combination thereof.

The light being emitted by the first wavelength shifter WLS1 may have a full width of half maximum (FWHM) of the emission wavelength spectrum, which may be equal to or less than about 45 nm, about 40 nm, or about 30 nm, thereby further improving the purity and reproducibility of colors produced by the display device 10. The light being emitted by the first wavelength shifter WLS1 may be emitted in various directions regardless of the incidence direction of the incident light. This makes possible to improve lateral visibility of the red color displayed in the first emission area LA1.

Part of the light emitted from the light emitting element layer EML may pass through the first wavelength conversion portion WLC1 rather than be converted to red light by the first wavelength shifter WLS1. The light emitted from the light emitting element layer EML and not converted by the first wavelength conversion portion WLC1 may be filtered out by the first color filter CF1. The red light produced by the first wavelength conversion portion WLC1 converting the light emitted from the light emitting element layer EML may pass through the first color filter CF1 to be emitted to the outside. Accordingly, the red light may be emitted through the first emission area LA1.

The second wavelength conversion portion WLC2 may be disposed in the second emission area LA2 on the first capping layer CAP1. The second wavelength conversion portion WLC2 may be surrounded by the second light blocking member BK2. The second wavelength conversion portion WLC2 may include a second base resin BS2, a second scatterer SCT2, and a second wavelength shifter WLS2.

The second base resin BS2 may contain a material having a relatively high light transmittance. The second base resin BS2 may be composed of a transparent organic material. For example, the second base resin BS2 may be made of the same material as the first base resin BS1, or may be made of the material exemplified in association with the first base resin BS1.

The second scatterer SCT2 may have a refractive index different from that of the second base resin BS2 and form an optical interface with the second base resin BS2. For example, the second scatterer SCT2 may contain a light scattering material or light scattering particles scattering at least part of the transmitted light. For example, the second scatterer SCT2 may be made of the same material as the first scatterer SCT1, or may be made of the material exemplified in association with the first scatterer SCT1. The second scatterer SCT2 may scatter the light in random directions regardless of the incidence direction of the incident light without any substantial change of the peak wavelength of the incident light.

The second wavelength shifter WLS2 may change or shift the wavelength of the incident light to a second peak wavelength that differs from the first peak wavelength shifted out by the first wavelength shifter WLS1. For example, the second wavelength shifter WLS2 may convert the wavelength of the light emitted from the display device 10 to a single peak wavelength in the range from about 510 nm to about 550 nm to produce green light. The second wavelength shifter WLS2 may be a quantum dot, a quantum rod, or a fluorescent substance. The second wavelength shifter WLS2 may contain the materials identical in purpose with the materials enumerated in association with the first wavelength shifter WLS1. The second wavelength shifter WLS2 may be composed of a quantum dot, a quantum rod, or a fluorescent substance to have a wavelength conversion range different from that of the first wavelength shifter WLS1.

The light transmission portion LTU may be disposed in the third emission area LA3 on the first capping layer CAP1. The light transmission portion LTU may be surrounded by the second light blocking member BK2. The light transmission portion LTU may allow the incident light to pass therethrough while maintaining the peak wavelength of the light. The light transmission portion LTU may include a third base resin BS3 and a third scatterer SCT3.

The third base resin BS3 may contain a material having a relatively high light transmittance. The third base resin BS3 may be composed of a transparent organic material. For example, the third base resin BS3 may be made of the same material as the first base resin BS1 or the second base resin BS2, or may be made of the material exemplified in association with the first base resin BS1 or the second base resin BS2.

The third scatterer SCT3 may have a refractive index different from that of the third base resin BS3 and form an optical interface with the third base resin BS3. For example, the third scatterer SCT3 may contain a light scattering material or light scattering particles scattering at least part of the transmitted light. For example, the third scatterer SCT3 may be composed of the same material as the first scatterer SCT1 or the second scatterer SCT2, or may be made of the material exemplified in association with the first scatterer SCT1 or the second scatterer SCT2. The third scatterer SCT3 may scatter the light in random directions regardless of the incidence direction of the incident light without any substantial change of the peak wavelength of the incident light.

Since the first and second wavelength conversion portions WLC1 and WLC2 and the light transmission portion LTU may be disposed between the color filter layer CFL and the thin film transistor layer TFTL, the display device 10 may not require a separate substrate for the first and second wavelength conversion portions WLC1 and WLC2 and the light transmission portion LTU. Accordingly, the first and second wavelength conversion portions WLC1 and WLC2 and the light transmission portion LTU may be easily aligned in the first to third emission areas LA1, LA2, and LA3, respectively, and the thickness of the display device 10 may be relatively reduced.

The second capping layer CAP2 may cover the first and second wavelength conversion portions WLC1 and WLC2, the light transmission portion LTU, and the second light blocking member BK2. For example, the second capping layer CAP2 may seal the first and second wavelength conversion portions WLC1 and WLC2 and the light transmission portion LTU to prevent the first and second wavelength conversion portions WLC1 and WLC2 and the light transmission portion LTU from damage or contamination. The second capping layer CAP2 may be made of the same material as the first capping layer CAP1, or may be made of the material exemplified in association with the first capping layer CAP1.

The second planarization layer OC2 may be disposed on the second capping layer CAP2 to flatten the top portion of the wavelength conversion layer WLCL. The second planarization layer OC2 may include an organic material. For example, the second planarization layer OC2 may include at least one of an acrylic resin, an epoxy resin, a phenol resin, a polyamide resin, or a polyimide resin.

The thin film transistor layer TFTL may include a thin film transistor TFT, a gate insulating layer GI, an interlayer insulating layer ILD, a connection electrode CNE, a second passivation layer PAS2, and a third planarization layer OC3.

The thin film transistor TFT may be disposed on the second planarization layer OC2 of the wavelength conversion layer WLCL, and may constitute a pixel circuit of each of the pixels. For example, the thin film transistor TFT may be a switching transistor or a driving transistor of a pixel circuit. The thin film transistor TFT may include a semiconductor region ACT, a gate electrode GE, a source electrode SE, and a drain electrode DE.

The semiconductor region ACT, the source electrode SE, and the drain electrode DE may be disposed on the second planarization layer OC2 of the wavelength conversion layer WLCL. The semiconductor region ACT may overlap the gate electrode GE in the thickness direction, and may be insulated by the gate insulating layer GI. The source electrode SE and the drain electrode DE may be provided by making a material of the semiconductor region ACT conductive.

The gate electrode GE may be arranged on the gate insulating layer GI. The gate electrode GE may overlap the semiconductor region ACT with the gate insulating layer GI interposed therebetween.

The gate insulating layer GI may be provided on the semiconductor region ACT, the source electrode SE, and the drain electrode DE. For example, the gate insulating layer GI may cover the semiconductor region ACT, the source electrode SE, the drain electrode DE, and the second planarization layer OC2, and may insulate the semiconductor region ACT from the gate electrode GE. The gate insulating layer GI may include a contact hole through which the connection electrode CNE passes.

The interlayer dielectric layer ILD may be arranged on the gate electrode GE. For example, the interlayer insulating layer ILD may include a contact hole through which the connection electrode CNE passes. Here, the contact hole of the interlayer insulating layer ILD may be connected to the contact hole of the gate insulating layer GI.

The connection electrode CNE may be disposed on the interlayer insulating layer ILD. The connection electrode CNE may connect the drain electrode DE of the thin film transistor TFT to a first electrode AE of a light emitting element EL. The connection electrode CNE may be in contact with the drain electrode DE through the contact holes provided in the gate insulating layer GI and the interlayer insulating layer ILD.

The second passivation layer PAS2 may be provided on the connection electrode CNE to protect the thin film transistor TFT. For example, the second passivation layer PAS2 may include a contact hole through which the first electrode AE of the light emitting element EL passes.

The third planarization layer OC3 may be provided on the second passivation layer PAS2 to flatten the top portion of the thin film transistor layer TFTL. For example, the third planarization layer OC3 may include a contact hole through which the first electrode AE of the light emitting element EL passes. Here, the contact hole of the third planarization layer OC3 may be connected to the contact hole of the second passivation layer PAS2.

The light emitting element layer EML may include the light emitting element EL, a first contact electrode CTE1, a second contact electrode CTE2, a first insulating layer IL1, a second insulating layer IL2, a third passivation layer PAS3, and a reflective member RM.

The light emitting element EL may be disposed on the third planarization layer OC3 of the thin film transistor layer TFTL. The light emitting element EL may be disposed to overlap one of the first to third emission areas LA1, LA2, and LA3.

The light emitting element EL may include the first electrode AE, a second electrode CE, and the light emitting diode ED.

The first electrode AE may be disposed on the third planarization layer OC3 of the thin film transistor layer TFTL. The first electrode AE may be connected to the connection electrode CNE through the contact holes provided in the third planarization layer OC3 and the second passivation layer PAS2. The first electrode AE may be connected to the drain electrode DE of the thin film transistor TFT through the connection electrode CNE. The first electrode AE may be an anode electrode of the light emitting element EL, but is not limited thereto.

The second electrode CE may be disposed to be spaced apart from the first electrode AE, on the third planarization layer OC3 of the thin film transistor layer TFTL. For example, the second electrode CE may receive a common voltage supplied to all pixels. The second electrode CE may be a cathode electrode of the light emitting element EL, but is not limited thereto.

The light emitting diode ED may be disposed between the first electrode AE and the second electrode CE, on the third planarization layer OC3 of the thin film transistor layer TFTL. The light emitting diode ED may be disposed to be spaced apart from each of the first electrode AE and the second electrode CE. An end of the light emitting diode ED may be connected to the first electrode AE through the first contact electrode CTE1, and another end of the light emitting diode ED may be connected to the second electrode CE through the second contact electrode CTE2. For example, multiple light emitting diodes ED may each include an active layer having the same material to emit light of the same wavelength or light of the same color. Light emitted from each of the first to third emission areas LA1, LA2, and LA3 may have the same color. For example, the light emitting diodes ED may emit the third color light or blue light having a peak wavelength in the range of about 440 nm to about 480 nm. Therefore, the light emitting element layer EML may emit the third color light or blue light.

The first contact electrode CTE1 may cover the first electrode AE and an end of the light emitting diode ED. The first contact electrode CTE1 may connect an end of the light emitting diode ED to the first electrode AE. The first contact electrode CTE1 may be insulated from the second contact electrode CTE2 by the first insulating layer IL1 and the second insulating layer IL2.

The second contact electrode CTE2 may cover the second electrode CE and the other end of the light emitting diode ED. The second contact electrode CTE2 may connect the other end of the light emitting diode ED to the second electrode CE. The second contact electrode CTE2 may be insulated from the first contact electrode CTE1 by the first insulating layer IL1 and the second insulating layer IL2.

The first insulating layer IL1 may cover a portion of the light emitting diode ED. The first insulating layer IL1 may prevent the second contact electrode CTE2 from extending to an end of the light emitting diode EL. The first insulating layer IL1 may insulate the first contact electrode CTE1 from the second contact electrode CTE2.

The second insulating layer IL2 may cover the second electrode CE and a portion of the first insulating layer IL1, The second insulating layer IL2 may prevent the first contact electrode CTE1 from extending to the second contact electrode CTE2.

The third passivation layer PAS3 may cover the light emitting element EL, the first contact electrode CTE1, and the second contact electrode CTE2. The third passivation layer PAS3 may be disposed to overlap one of the first to third emission areas LA1, LA2, and LA3. The third passivation layer PAS3 may prevent infiltration of impurities such as moisture or air from the outside, thereby preventing damage to the light emitting elements EL.

The third passivation layer PAS3 may contain a material having a relatively high light transmittance. The third passivation layer PAS3 may be made of a transparent organic material. For example, the third passivation layer PAS3 may contain at least one organic material of an epoxy resin, an acrylic resin, a cardo resin, or an imide resin. For example, the third passivation layer PAS3 may determine the shape of the reflective member RM.

The reflective member RM may cover the third passivation layer PAS3. The reflective member RM may reflect light L emitted from the light emitting diode ED toward the substrate SUB. The light L emitted from the light emitting diode ED may be reflected by the reflective member RM, and pass through the thin film transistor layer TFTL, the wavelength conversion layer WLCL, and the color filter layer CFL to be transmitted to the front of the display device 10. For example, the light L reflected by the reflective member RM may pass through the first wavelength conversion portion WLC1 and the first color filter CF1 to be transmitted to the first emission area LA1. The light reflected by the reflective member RM may pass through the second wavelength conversion portion WLC2 and the second color filter CF2 to be transmitted to the second emission area LA2. The light reflected by the reflective member RM may pass through the light transmission portion LTU and the third color filter CF3 to be transmitted to the third emission area LA3. The shape of the reflective member RM may be determined by the third passivation layer PAS3, and the reflective member RM may have a shape capable of maximizing the light emission efficiency of the light emitting element layer EML.

For example, the reflective member RM may include nitride, oxide, or an alloy containing at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), copper (Cu), lithium fluoride/calcium (LiF/Ca), or lithium fluoride/aluminum (LiF/Al). The reflective member RM may have a single layer structure or a multilayer structure.

The encapsulation layer TFE may cover the light emitting element layer EML. For example, the encapsulation layer TFE may cover the top and side surfaces of the reflective member RM and a portion of the thin film transistor layer TFTL. For example, the encapsulation layer TFE may include at least one inorganic film to prevent permeation of oxygen or moisture. The encapsulation layer TFE may include at least one organic film to protect the display device 10 from foreign substances such as dust.

The metal layer HRL may be disposed on the encapsulation layer TFE. The metal layer HRL may discharge heat generated inside the display device 10 to the outside. The thermal conductivity of the metal layer HRL may be higher than that of the encapsulation layer TFE. In case of receiving heat generated in the light emitting element layer EML or the thin film transistor layer TFTL through the encapsulation layer TFE, the metal layer HRL may discharge the heat to outside of the display device 10.

The protective film PF may be disposed on the metal layer HRL. The protective film PF may cover the metal layer HRL to prevent damage to the metal layer HRL.

Figure 5:
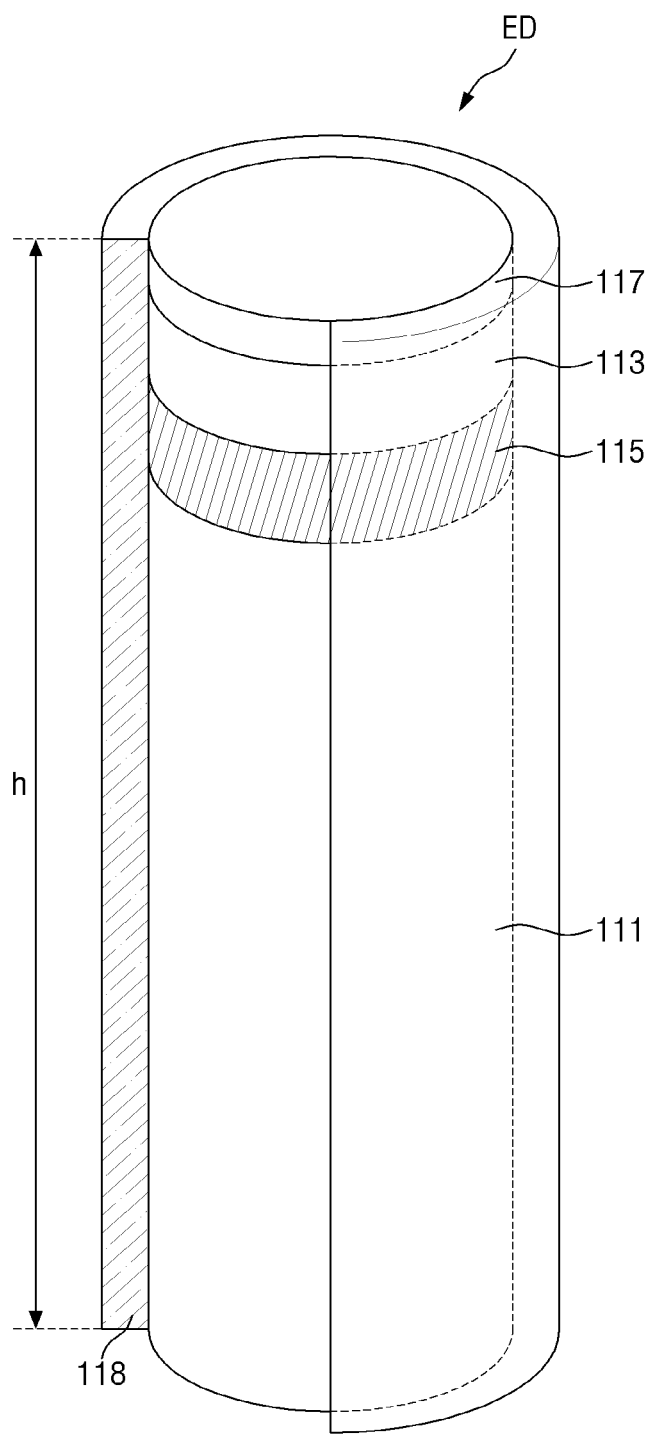
FIG. 5 is a schematic view showing a light emitting element according to an embodiment.

FIG. 5 is a schematic view showing a light emitting element according to an embodiment.

Referring to FIG. 5, the light emitting diode ED may include a first semiconductor layer 111, a second semiconductor layer 113, an active layer 115, an electrode layer 117, and an insulating layer 118. For example, the light emitting diode ED may have a micro-meter or nano-meter size, and may be an inorganic light emitting diode including an inorganic material. The inorganic light emitting diode may be aligned between two electrodes opposing each other by an electric field formed in a specific direction between the two electrodes.

The first semiconductor layer 111 may be an n-type semiconductor. For example, in case that the light emitting diode ED emits blue light, the first semiconductor layer 111 may include a semiconductor material having a chemical formula of $Al_xGa_yIn_{1-x-y}N$ ($0 \le x \le 1$, $0 \le y \le 1$, $0 \le x+y \le 1$). The first semiconductor layer 111 may include at least one semiconductor material of n-type doped AlGaInN, GaN, AlGaN, InGaN, AlN, or InN. The first semiconductor layer 111 may be doped with n-type dopants such as Si, Ge, and Sn. The first semiconductor layer 111 may be n-type Si-doped n-GaN. The length of the first semiconductor layer 111 may have a range of about 1.5 μm to about 5 but is not limited thereto.

The second semiconductor layer 113 may be disposed on the active layer 115. For example, in case that the light emitting diode ED emits blue or green light, the second semiconductor layer 113 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 113 may include at least one semiconductor material of p-type doped AlGaInN, GaN, AlGaN, InGaN, AlN, or InN. The second semiconductor layer 113 may be doped with p-type dopants such as Mg, Zn, Ca, Se, and Ba. The second semiconductor layer 113 may be p-type Mg-doped p-GaN. The length of the second semiconductor layer 113 may have a range of about 0.05 μm to about 0.10 but is not limited thereto.

Each of the first and second semiconductor layers 111 and 113 may be formed as a single layer, but the present disclosure is not limited thereto. For example, each of the first and second semiconductor layers 111 and 113 may have multiple layers including a cladding layer or a tensile strain barrier reducing (TSBR) layer.

The active layer 115 may be disposed between the first and second semiconductor layers 111 and 113. The active layer 115 may include a material having a single or multiple quantum well structure. In case that the active layer 115 includes a material having a multiple quantum well structure, quantum layers and well layers may be stacked alternately. The active layer 115 may emit light by coupling of electron-hole pairs according to an electric signal applied through the first and second semiconductor layers 111 and 113. For example, in case that the active layer 115 emits blue light, a material such as AlGaN or AlGaInN may be included. In case that the active layer 115 has a multiple quantum well structure in which quantum layers and well layers may be alternately stacked, the quantum layer may include a material such as AlGaN or AlGaInN, and the well layer may include a material such as GaN or AlInN. The active layer 115 may include AlGaInN as the quantum layer and AlInN as the well layer to emit blue light.

As another example, the active layer 115 may have a structure in which semiconductor materials having large band gap energy and semiconductor materials having small band gap energy may be alternately stacked, and may include Group III to V semiconductor materials according to the wavelength band of the emitted light. The light emitted by the active layer 115 is not limited to blue light, and the active layer 115 may emit red or green light in some cases. The length of the active layer 115 may have a range of about 0.05 μm to about 0.10 but is not limited thereto.

Light emitted from the active layer 115 may be emitted in the longitudinal direction of the light emitting diode ED, and may also be emitted from both side surfaces. The directionality of the light emitted from the active layer 115 may not be limited.

The electrode layer 117 may be an ohmic contact electrode. As another example, the electrode layer 117 may be a Schottky contact electrode. The light emitting diode ED may include at least one electrode layer 117. In case that the light emitting diode ED is electrically connected to an electrode, the electrode layer 117 may reduce resistance between the light emitting diode ED and the electrode. The electrode layer 117 may contain conductive metal. For example, the electrode layer 117 may include at least one of aluminum (Al), titanium (Ti), indium (In), gold (Au), silver (Ag), indium tin oxide (ITO), indium zinc oxide (IZO), or indium tin zinc oxide (ITZO). The electrode layer 117 may include an n-type or p-type doped semiconductor material.

The insulating layer 118 may surround the outer surfaces of the semiconductor layers and electrode layers. The insulating layer 118 may surround the outer surface of the active layer 115, and may extend in the extending direction of the light emitting diode ED. The insulating layer 118 may protect the light emitting diode ED. For example, the insulating layer 118 may surround the side surface of the light emitting diode ED, and may expose the ends of the light emitting diode ED in the longitudinal direction.

The insulating layer 118 may include materials having insulating properties, for example, silicon oxide (SiOx), silicon nitride (SiNx), silicon oxynitride (SiOxNy), aluminum nitride (AlN), aluminum oxide (A2O3), and the like, or a combination thereof. Accordingly, the insulating layer 118 may prevent an electrical short circuit that may occur in case that the active layer 115 may be in direct contact with the electrode through which the electrical signal may be transmitted to the light emitting diode ED. The insulating layer 118 includes the active layer 115 to protect the outer surface of the light emitting diode ED, thereby preventing a decrease in light emission efficiency.

The outer surface of the insulating layer 118 may be surface-treated. In manufacturing the display device 10, the light emitting diodes ED may be aligned by being sprayed on the electrodes in a state of being dispersed in ink. The surface of the insulating layer 118 may be subjected to a hydrophobic or hydrophilic treatment, so that the light emitting diode ED can maintain a dispersed state without being aggregated with other adjacent light emitting diodes ED in the ink.

Figure 6:
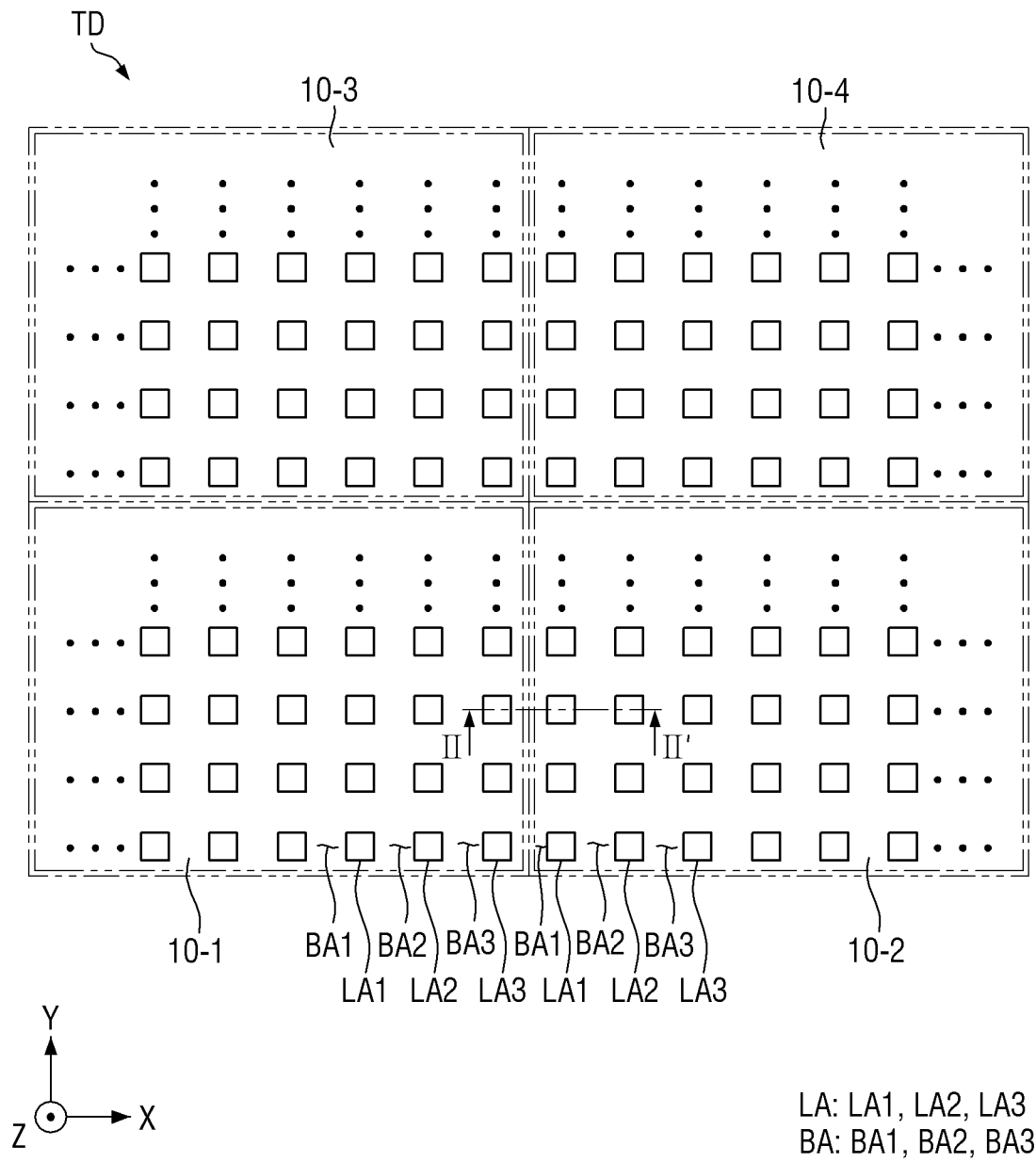
FIG. 6 is a schematic plan view illustrating a bonding structure of a tiled display device according to an embodiment.
Figure 7:
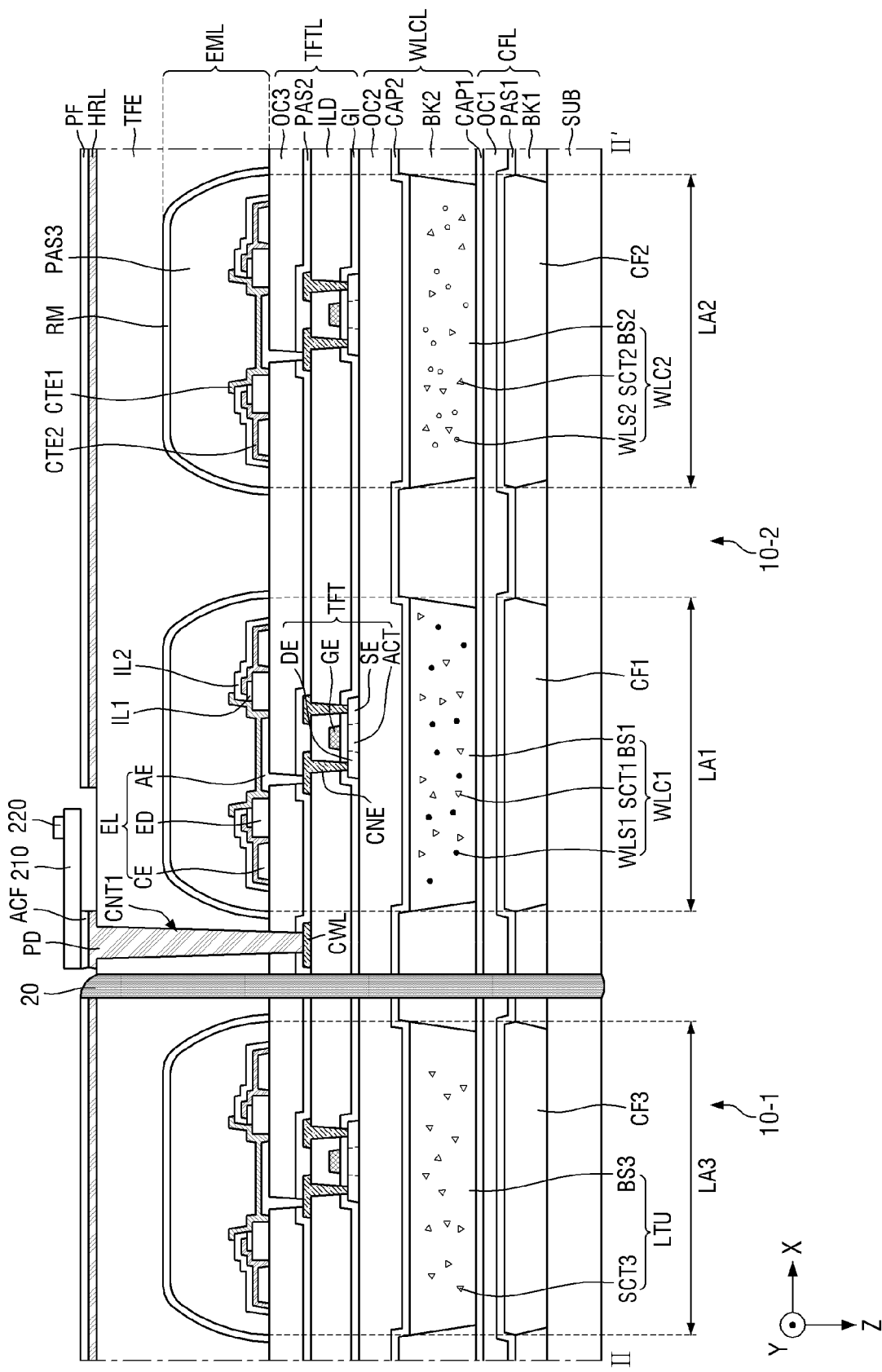
FIG. 7 is a schematic cross-sectional view of an example, taken along line II-II' of FIG. 6.

FIG. 6 is a schematic plan view illustrating a bonding structure of a tiled display device according to an embodiment. FIG. 7 is a schematic cross-sectional view of an example, taken along line II-II' of FIG. 6. Hereinafter, a description of configurations identical to those described above will be briefly given or omitted.

Referring to FIGS. 6 and 7, the tiled display device TD may include multiple display devices 10 and a bonding member 20. For example, the tiled display device TD may include first to fourth display devices 10-1 to 10-4, but the number of the display devices 10 is not limited to that illustrated in the embodiment of FIG. 6. The number of the display devices 10 may be determined according to the size of each of the display devices 10 and the tiled display device TD.

Each of the first and second display devices 10 may include the substrate SUB, the color filter layer CFL, the wavelength conversion layer WLCL, the thin film transistor layer TFTL, the light emitting element layer EML, the encapsulation layer TFE, the metal layer HRL, the protective film PF, a pad portion PD, a connection film ACF, a flexible film 210, and a source driver 220.

The substrate SUB may be a base substrate or a base member, and may be made of an insulating material such as a polymer resin. For example, the substrate SUB may be a flexible substrate which can be bent, folded and rolled. The substrate SUB may include polyimide (PI), but is not limited thereto.

The color filter layer CFL, the wavelength conversion layer WLCL, the thin film transistor layer TFTL, the light emitting element layer EML, and the encapsulation layer TFE may be sequentially stacked on the substrate SUB. Therefore, the substrate SUB may support the display device 10. Since the color filter layer CFL, the wavelength conversion layer WLCL, the thin film transistor layer TFTL, the light emitting element layer EML, and the encapsulation layer TFE may be sequentially stacked on the substrate SUB, the display device 10 may not require a separate substrate for the wavelength conversion layer WLCL or the color filter layer CFL. Therefore, the thickness of the display device 10 may be relatively reduced.

The thin film transistor layer TFTL may include a connection line CWL disposed on the interlayer insulating layer ILD. The connection line CWL may be made of the same material in the same layer as the connection electrode CNE. The connection line CWL may be disposed in the non-display area NDA or the light blocking area BA of the display area DA. The connection line CWL may overlap the first light blocking member BK1 and the second light blocking member BK2. The connection line CWL may provide, to the thin film transistor TFT, a voltage or a signal supplied from the pad portion PD. For example, the connection line CWL may supply a data voltage received from the pad portion PD to a data line, and supply a power voltage received from the pad portion PD to a power line.

The pad portion PD may be disposed on the encapsulation layer TFE at the edge of the display device 10. The pad portion PD may be connected to the connection line CWL of the thin film transistor layer TFTL through a first contact hole CNT1 that penetrates the encapsulation layer TFE, the third planarization layer OC3, and the second passivation layer PAS2. The pad portion PD may supply a voltage or a signal received from the flexible film 210 or the source driver 220 to the connection line CWL.

The pad portion PD may be disposed at the rear of the display device 10. For example, light emitted from the light emitting element layer EML may be reflected by the reflective member RM to be transmitted to the front of the display device 10 through the thin film transistor layer TFTL, the wavelength conversion layer WLCL, the color filter layer CFL, and the substrate SUB. Since the pad portion PD may be disposed at the rear of the display device 10, the size of the non-display area NDA of the display device 10 may be minimized. For example, the pad portion PD may be disposed in the non-display area NDA or the light blocking area BA of the display area DA. The pad portion PD may overlap the first light blocking member BK1 and the second light blocking member BK2. Accordingly, in the tiled display device TD, the gap between the display devices 10 may be minimized, thereby preventing the user from recognizing the boundary portions or the non-display areas NDA between the multiple display devices 10.

The pad portion PD may be made of the same material in the same layer as the metal layer HRL. A material constituting the pad portion PD and the metal layer HRL may be coated on the encapsulation layer TFE and patterned to form the pad portion PD and the metal layer HRL. Accordingly, the display device 10 may reduce process steps, process time, and manufacturing cost.

The connection film ACF may attach the flexible film 210 to the pad electrode PD. A surface of the connection film ACF may be attached to the pad electrode PD, and the other surface of the connection film ACF may be attached to the flexible film 210. For example, the connection film ACF may cover the entire pad electrode PD, but is not limited thereto.

The connection film ACF may include an anisotropic conductive film. In case that the connection film ACF includes the anisotropic conductive film, the connection film ACF may have conductivity in a region where the pad electrode PD and a contact pad of the flexible film 210 contact each other, and may electrically connect the flexible film 210 to the pad electrode PD.

The flexible film 210 may be disposed on the pad portion PD. A side of the flexible film 210 may be connected to the pad electrode PD, and the other side of the flexible film 210 may be connected to a source circuit board (not shown). The flexible film 210 may transmit a signal from the source driver 220 to the display device 10. For example, the source driver 220 may be an integrated circuit (IC). In response to a source control signal of a timing controller, the source driver 220 may convert digital video data into an analog data voltage, and may supply it to a data line of the display area DA through the flexible film 210.

The bonding member 20 may be disposed between the display devices 10 to bond the side surfaces of the adjacent display devices 10 to each other. The bonding member 20 may connect the side surfaces of the first to fourth display devices 10-1 to 10-4 arranged in a grid form to implement the tiled display device TD. The bonding member 20 may bond the side surfaces of the adjacent display devices 10 to each other.

For example, the bonding member 20 may be made of an adhesive or a double-sided tape having a relatively thin thickness to minimize the gap between the display devices 10. As another example, the bonding member 20 may be formed of a bonding frame having a relatively thin thickness to minimize the gap between the display devices 10. Accordingly, in the tiled display device TD, it may be possible to prevent the user from recognizing the boundary portions or the non-display areas NDA between the multiple display devices 10.

Figure 8:
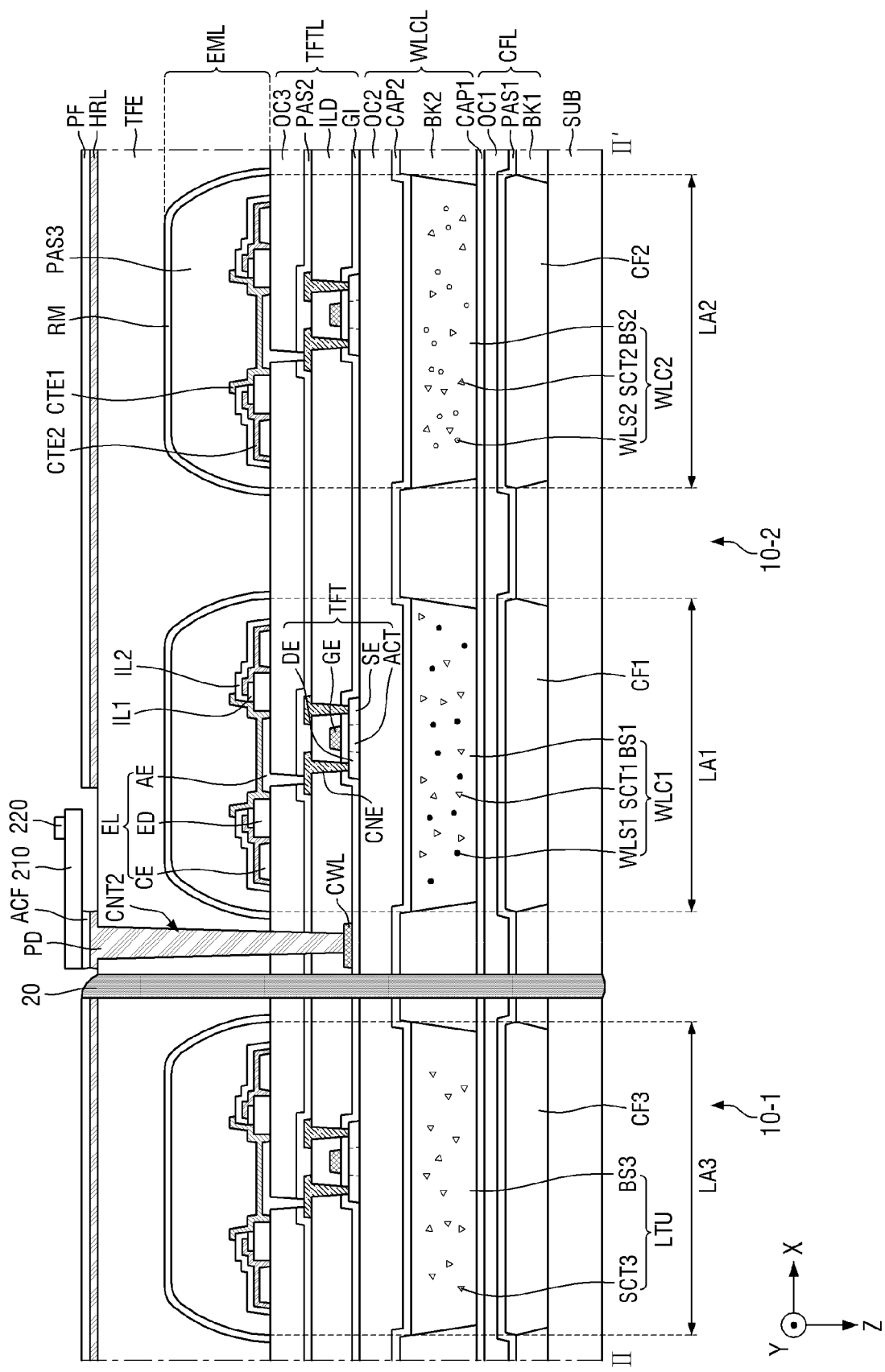
FIG. 8 is a schematic cross-sectional view of another example taken along line II-II' of FIG. 6.

FIG. 8 is a schematic cross-sectional view of another example taken along line II-II' of FIG. 6. The display device illustrated in FIG. 8 is different from the display device illustrated in FIG. 7 in the configuration of the connection line CWL. A description of the same configuration as the above-described configuration will be briefly given or omitted.

Referring to FIG. 8, the thin film transistor layer TFTL may include the connection line CWL disposed on the gate insulating layer GI. The connection line CWL may be made of the same material in the same layer as the gate electrode GE of the thin film transistor TFT. The connection line CWL may be disposed in the non-display area NDA or the light blocking area BA of the display area DA. The connection line CWL may overlap the first light blocking member BK1 and the second light blocking member BK2. The connection line CWL may provide, to the thin film transistor TFT, a voltage or a signal supplied from the pad portion PD. For example, the connection line CWL may supply a gate signal received from the pad portion PD to a gate line, and supply an emission signal received from the pad portion PD to an emission control line.

The pad portion PD may be disposed on the encapsulation layer TFE at the edge of the display device 10. The pad portion PD may be connected to the connection line CWL of the thin film transistor layer TFTL through a second contact hole CNT2 that penetrates the encapsulation layer TFE, the third planarization layer OC3, the second passivation layer PAS2, and the interlayer insulating layer ILD. The pad portion PD may supply a voltage or a signal received from the flexible film 210 or the source driver 220 to the connection line CWL.

Figure 9:
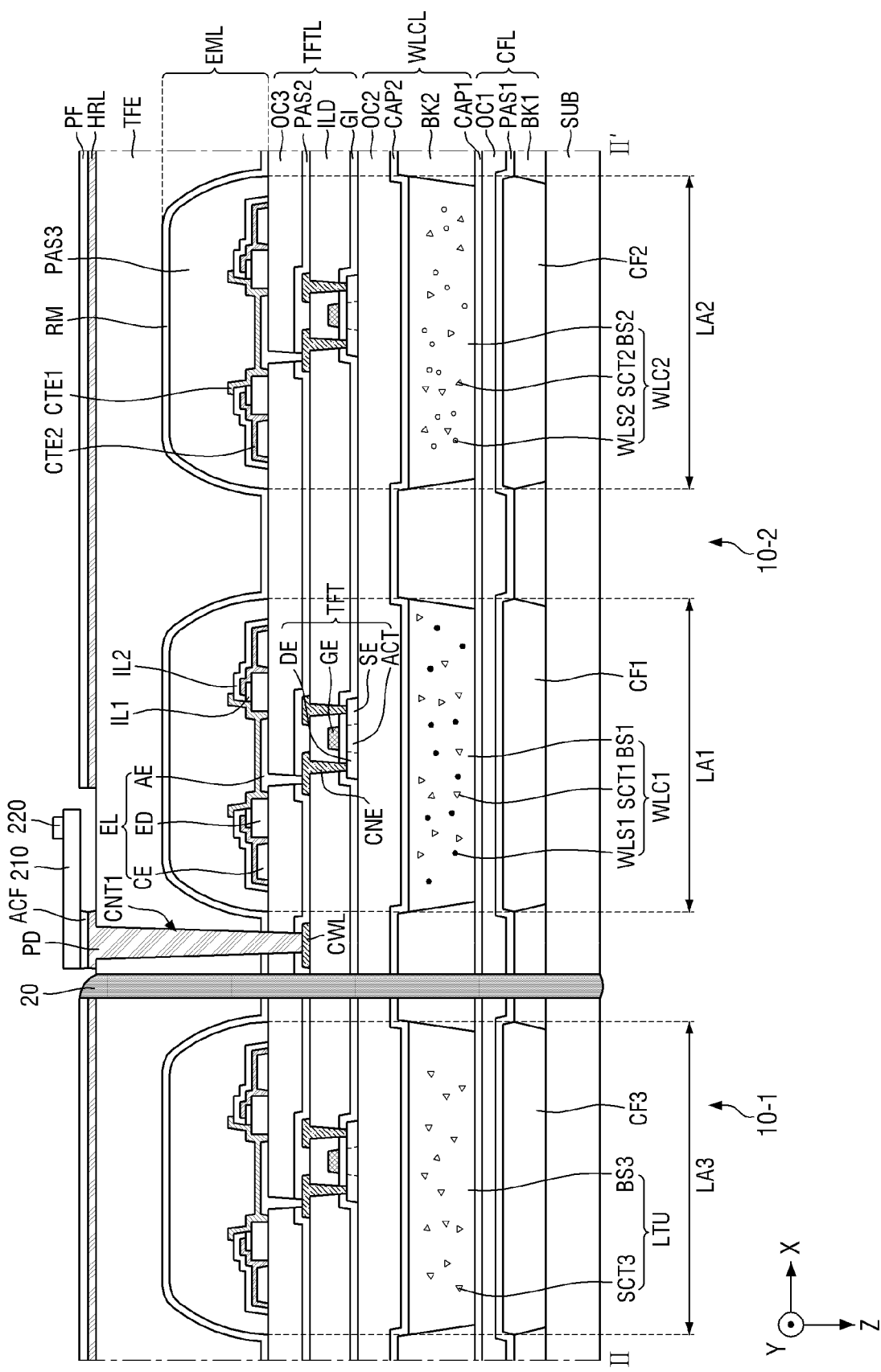
FIG. 9 is a schematic cross-sectional view of still another example taken along line II-II' of FIG. 6.

FIG. 9 is a schematic cross-sectional view of still another example taken along line II-II' of FIG. 6. The display device illustrated in FIG. 9 is different from the display device illustrated in FIG. 7 in the configuration of the reflective member RM. A description of the same configuration as the above-described configuration will be briefly given or omitted.

Referring to FIG. 9, each of the first and second display devices 10 may include the substrate SUB, the color filter layer CFL, the wavelength conversion layer WLCL, the thin film transistor layer TFTL, the light emitting element layer EML, the encapsulation layer TFE, the metal layer HRL, the protective film PF, the pad portion PD, the connection film ACF, the flexible film 210, and the source driver 220.

The light emitting element layer EML may include the light emitting element EL, the first contact electrode CTE1, the second contact electrode CTE2, the first insulating layer IL1, the second insulating layer IL2, and the third passivation layer PAS3, and the reflective member RM.

The reflective member RM may cover the third passivation layer PAS3 and the third planarization layer OC3. The reflective member RM may reflect light L emitted from the light emitting diode ED toward the substrate SUB. The light L emitted from the light emitting diode ED may be reflected by the reflective member RM, and pass through the thin film transistor layer TFTL, the wavelength conversion layer WLCL, and the color filter layer CFL to be transmitted to the front of the display device 10. For example, the light L reflected by the reflective member RM may pass through the first wavelength conversion portion WLC1 and the first color filter CF1 to be transmitted to the first emission area LA1. The light reflected by the reflective member RM may pass through the second wavelength conversion portion WLC2 and the second color filter CF2 to be transmitted to the second emission area LA2. The light reflected by the reflective member RM may pass through the light transmission portion LTU and the third color filter CF3 to be transmitted to the third emission area LA3. The shape of the reflective member RM may be determined by the third passivation layer PAS3 and the third planarization layer OC3, and the reflective member RM may have a shape capable of maximizing the light emission efficiency of the light emitting element layer EML.

For example, the reflective member RM may include nitride, oxide, or an alloy containing at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), copper (Cu), lithium fluoride/calcium (LiF/Ca), and lithium fluoride/aluminum (LiF/Al). The reflective member RM may have a single layer structure or a multilayer structure.

The encapsulation layer TFE may cover the light emitting element layer EML. The encapsulation layer TFE may cover the reflective member RM. For example, the encapsulation layer TFE may cover a portion of the reflective member RM covering the third protective layer PAS3 and another portion of the reflective member RM covering the third planarization layer OC3. For example, the encapsulation layer TFE may include at least one inorganic film to prevent permeation of oxygen or moisture. The encapsulation layer TFE may include at least one organic film to protect the display device 10 from foreign substances such as dust.

FIGS. 10 to 18 are schematic cross-sectional views illustrating a manufacturing process of a display device according to an embodiment.

Figure 10:
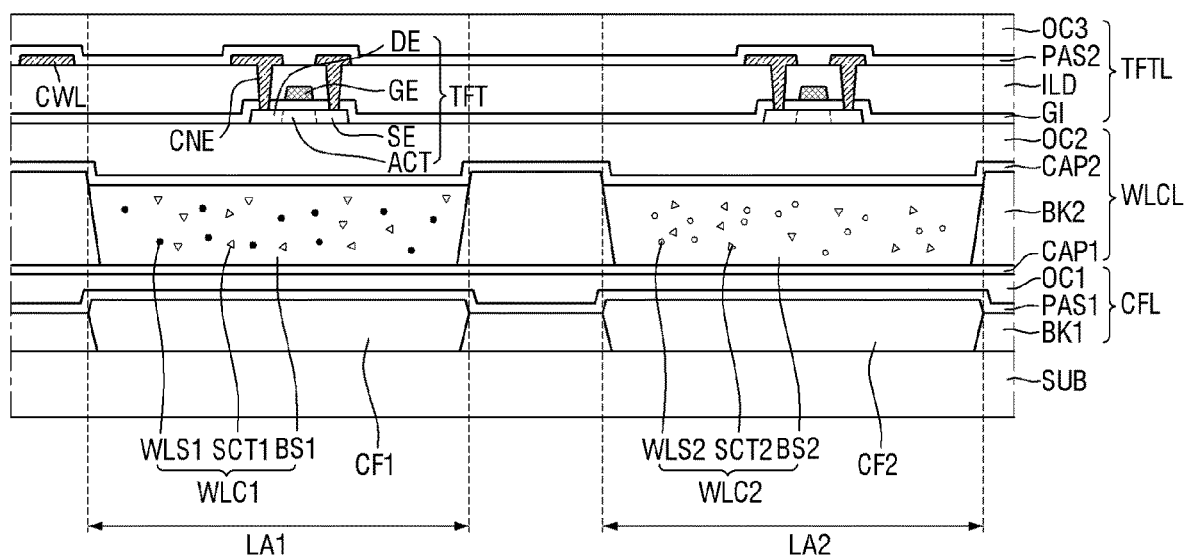
FIGS. 10 to 18 are schematic cross-sectional views illustrating a manufacturing process of a display device according to an embodiment.

In FIG. 10, the color filter layer CFL, the wavelength conversion layer WLCL, and the thin film transistor layer TFTL may be sequentially stacked on the substrate SUB.

The color filter layer CFL may include a first light blocking member BK1, first to third color filters CF1, CF2, and CF3, and a first planarization layer OC1.

The wavelength conversion layer WLCL may include a first capping layer CAP1, the second light blocking member BK2, the first wavelength conversion portion WLC1, the second wavelength conversion portion WLC2, the light transmission portion LTU, and a second capping layer CAP2 and a second planarization layer OC2.

The thin film transistor layer TFTL may include a thin film transistor TFT, a gate insulating layer GI, an interlayer insulating layer ILD, a connection electrode CNE, a second passivation layer PAS2, and a third planarization layer OC3.

Figure 11:
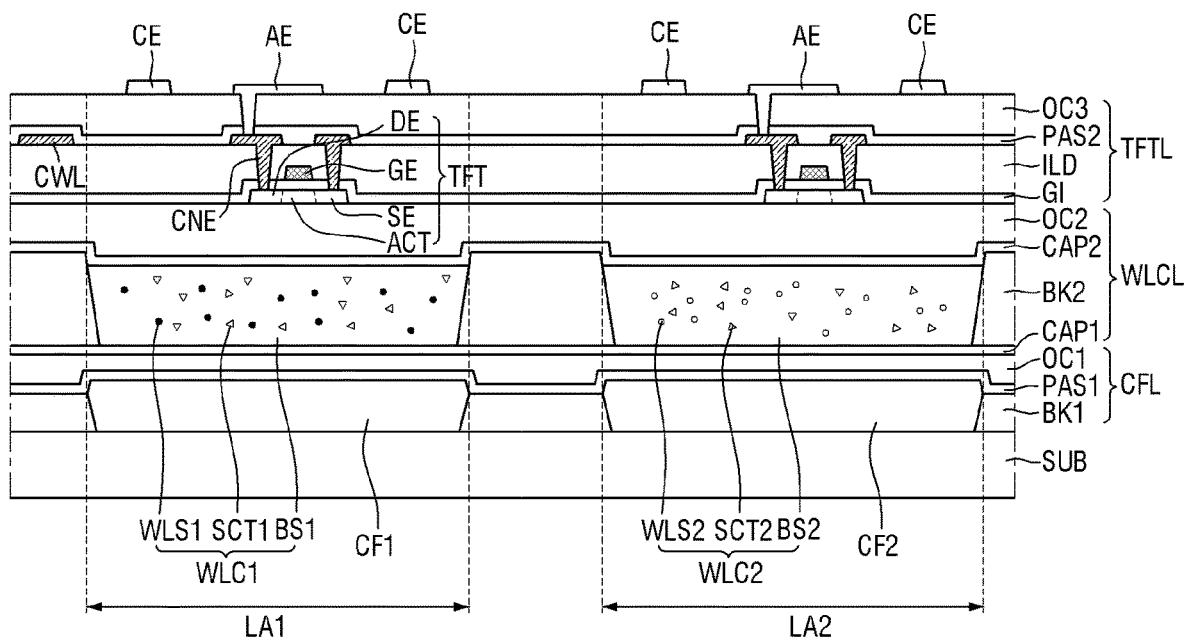

In FIG. 11, the first electrode AE may be disposed on the third planarization layer OC3 of the thin film transistor layer TFTL. The first electrode AE may be connected to the connection electrode CNE through the contact holes provided in the third planarization layer OC3 and the second passivation layer PAS2. The first electrode AE may be connected to the drain electrode DE of the thin film transistor TFT through the connection electrode CNE. The first electrode AE may be an anode electrode of the light emitting element EL, but is not limited thereto.

The second electrode CE may be disposed to be spaced apart from the first electrode AE, on the third planarization layer OC3 of the thin film transistor layer TFTL. For example, the second electrode CE may receive a common voltage supplied to all pixels. The second electrode CE may be a cathode electrode of the light emitting element EL, but is not limited thereto.

Figure 12:
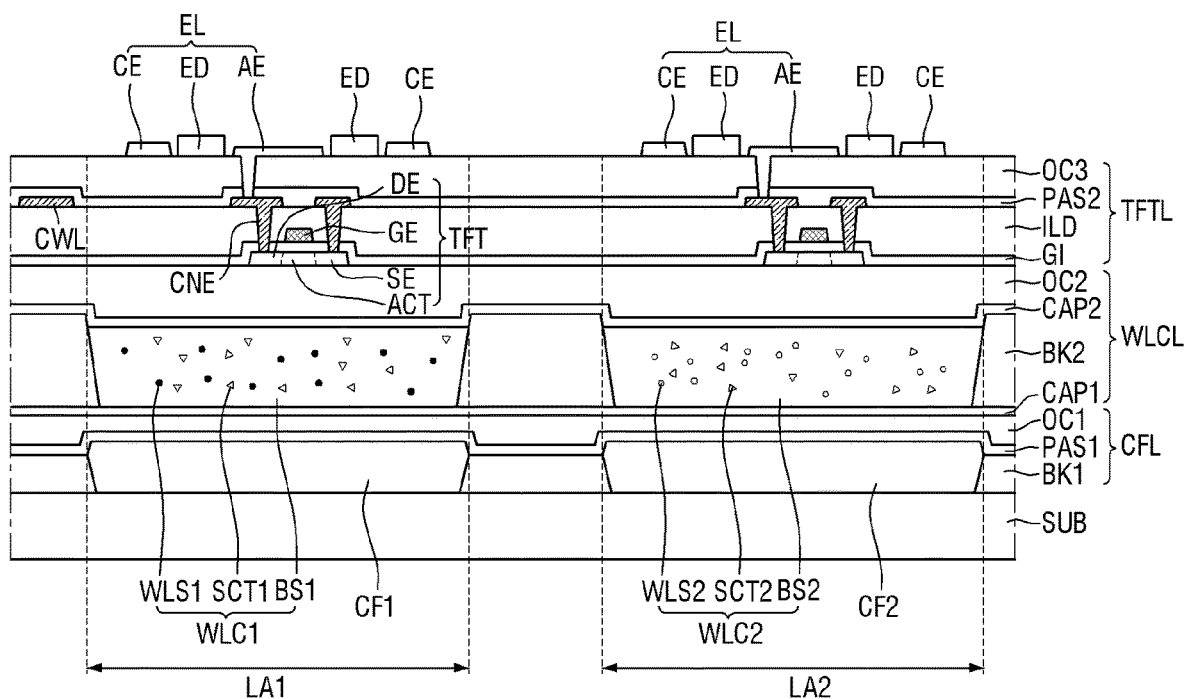

In FIG. 12, the light emitting diode ED may be disposed between the first electrode AE and the second electrode CE, on the third planarization layer OC3 of the thin film transistor layer TFTL. The light emitting diode ED may be disposed to be spaced apart from each of the first electrode AE and the second electrode CE. The light emitting diode ED may be aligned between the first electrode AE and the second electrode CE by an electric field formed in a specific direction between the first electrode AE and the second electrode CE. For example, a p-type semiconductor layer of the light emitting diode ED may face the first electrode AE, and an n-type semiconductor layer of the light emitting diode ED may face the second electrode CE, but the present disclosure is not limited thereto.

Figure 13:
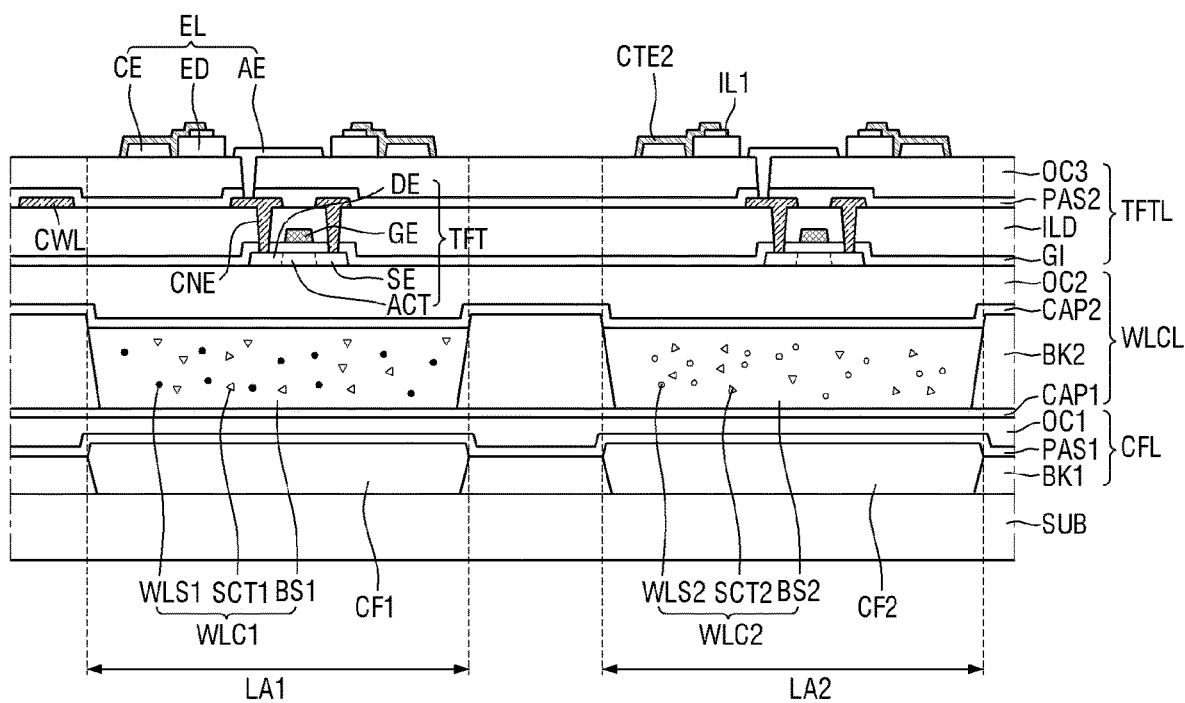

In FIG. 13, the first insulating layer IL1 may cover a portion of the light emitting diode ED. The first insulating layer IL1 may prevent the second contact electrode CTE2 from extending to an end of the light emitting diode EL.

The second contact electrode CTE2 may cover the second electrode CE and another end of the light emitting diode ED. For example, the second contact electrode CTE2 may connect the n-type semiconductor layer of the light emitting diode ED to the second electrode CE.

Figure 14:
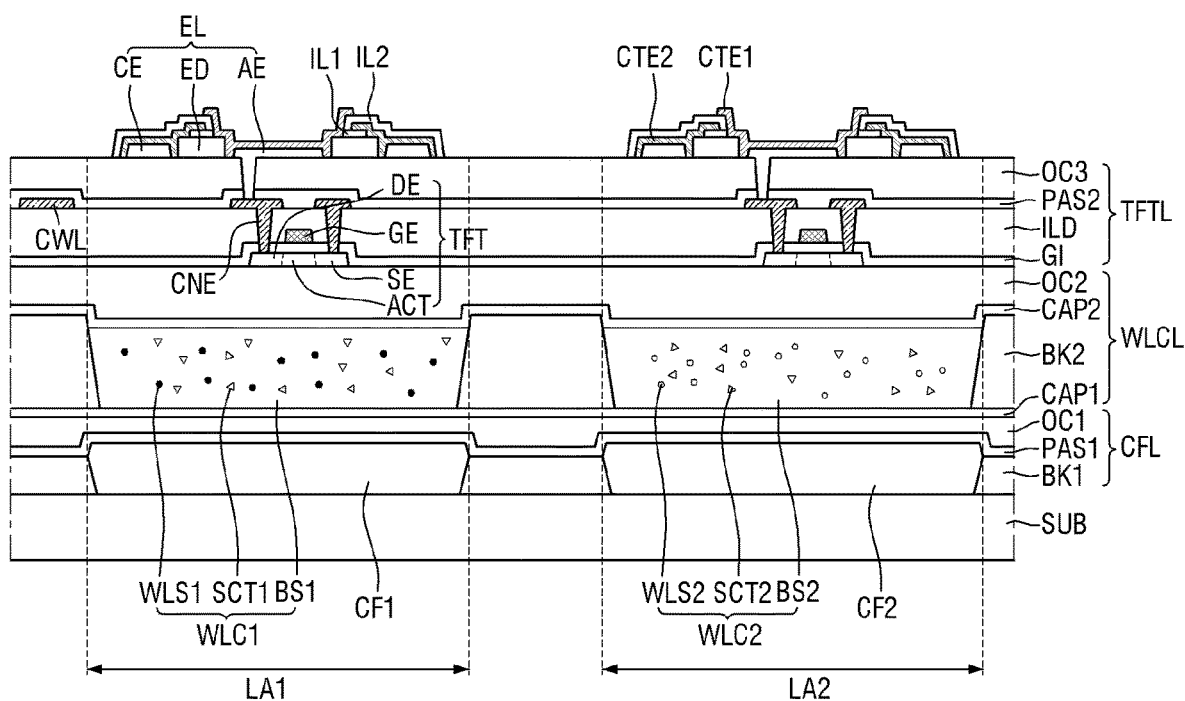

In FIG. 14, the second insulating layer IL2 may cover the second electrode CE and a portion of the first insulating layer IL1, The second insulating layer IL2 may prevent the first contact electrode CTE1 from extending to the second contact electrode CTE2.

The first contact electrode CTE1 may cover the first electrode AE and an end of the light emitting diode ED. For example, the first contact electrode CTE1 may connect the p-type semiconductor layer of the light emitting diode ED to the first electrode AE. The first contact electrode CTE1 may be insulated from the second contact electrode CTE2 by the first insulating layer IL1 and the second insulating layer IL2.

Figure 15:
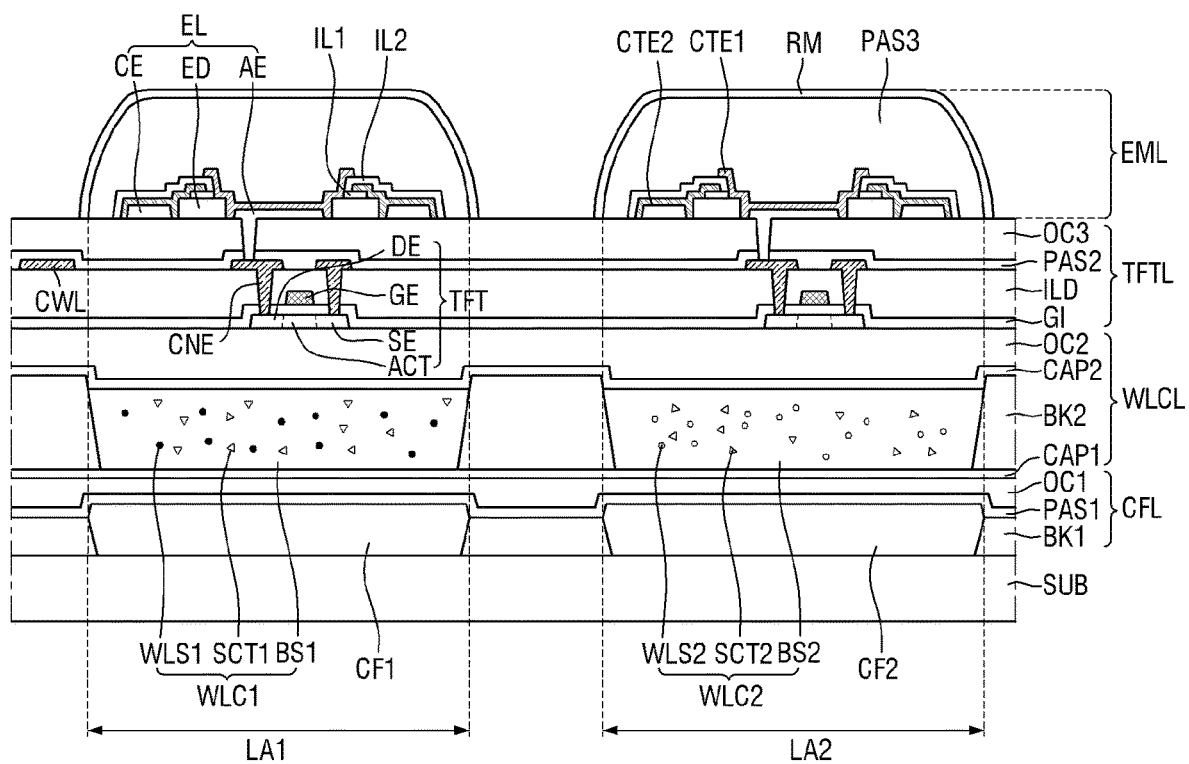

In FIG. 15, the third passivation layer PAS3 may cover the light emitting element EL, the first contact electrode CTE1, and the second contact electrode CTE2. The third passivation layer PAS3 may be disposed to overlap one of the first to third emission areas LA1, LA2, and LA3. The third passivation layer PAS3 may prevent infiltration of impurities such as moisture or air from the outside, thereby preventing damage to the light emitting elements EL.

The third passivation layer PAS3 may contain a material having a relatively high light transmittance. The third passivation layer PAS3 may be made of a transparent organic material. For example, the third passivation layer PAS3 may contain at least one organic material of an epoxy resin, an acrylic resin, a cardo resin, or an imide resin. For example, the third passivation layer PAS3 may determine the shape of the reflective member RM.

The reflective member RM may cover the third passivation layer PAS3. The reflective member RM may reflect light L emitted from the light emitting diode ED toward the substrate SUB. The light L emitted from the light emitting diode ED may be reflected by the reflective member RM, and pass through the thin film transistor layer TFTL, the wavelength conversion layer WLCL, and the color filter layer CFL to be transmitted to the front of the display device 10. For example, the light L reflected by the reflective member RM may pass through the first wavelength conversion portion WLC1 and the first color filter CF1 to be transmitted to the first emission area LA1. The light reflected by the reflective member RM may pass through the second wavelength conversion portion WLC2 and the second color filter CF2 to be transmitted to the second emission area LA2. The light reflected by the reflective member RM may pass through the light transmission portion LTU and the third color filter CF3 to be transmitted to the third emission area LA3. The shape of the reflective member RM may be determined by the third passivation layer PAS3, and the reflective member RM may have a shape capable of maximizing the light emission efficiency of the light emitting element layer EML.

For example, the reflective member RM may include nitride, oxide, or an alloy containing at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), copper (Cu), lithium fluoride/calcium (LiF/Ca), and lithium fluoride/aluminum (LiF/Al). The reflective member RM may have a single layer structure or a multilayer structure.

Figure 16:
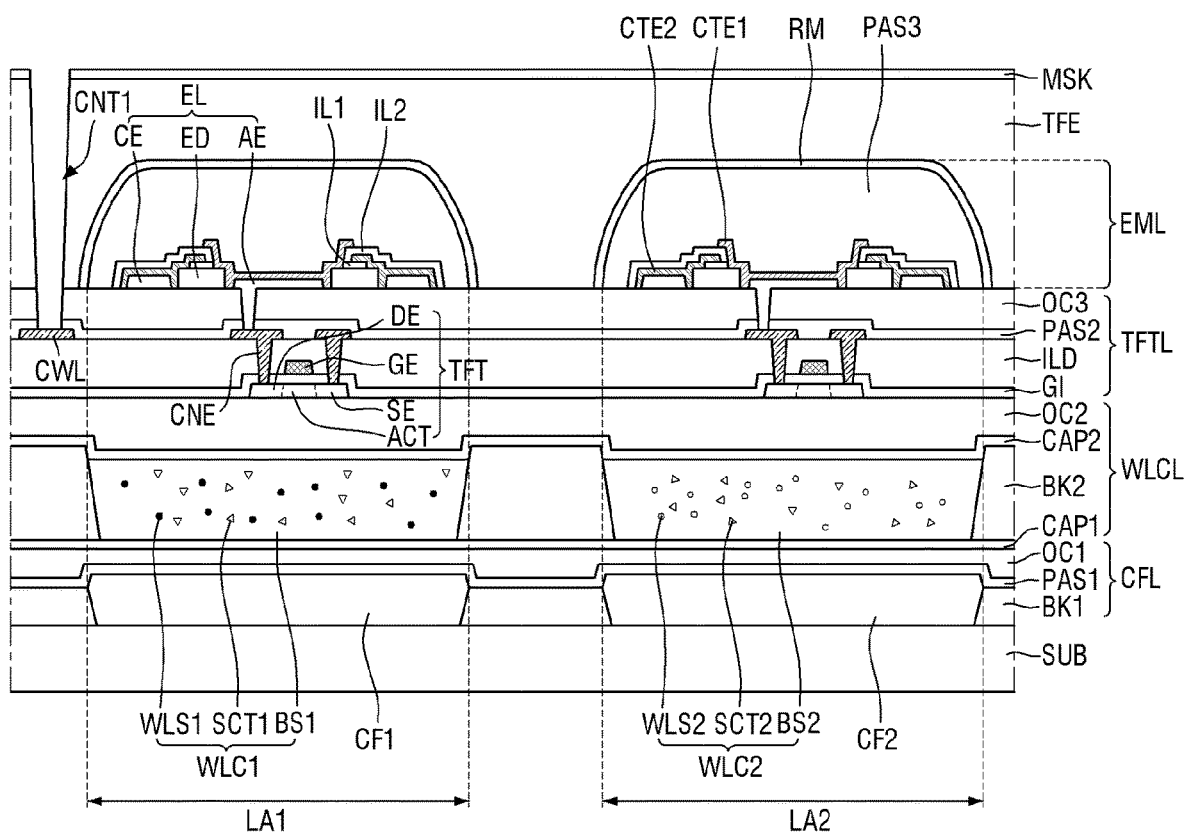

In FIG. 16, the encapsulation layer TFE may cover the light emitting element layer EML. For example, the encapsulation layer TFE may cover the top and side surfaces of the reflective member RM and a portion of the thin film transistor layer TFTL. For example, the encapsulation layer TFE may include at least one inorganic film to prevent permeation of oxygen or moisture. The encapsulation layer TFE may include at least one organic film to protect the display device 10 from foreign substances such as dust.

The first contact hole CNT1 may be patterned by a mask MSK provided on the encapsulation layer TFE. For example, a material forming the mask MSK may be provided on the encapsulation layer TFE and patterned through a wet etching process. The encapsulation layer TFE, the third planarization layer OC3, and the second passivation layer PAS2 may be partially patterned through a dry etching process. The mask MSK may be removed after the first contact hole CNT1 may be formed. The process of forming the first contact hole CNT1 is not limited to a wet etching process or a dry etching process.

Figure 17:
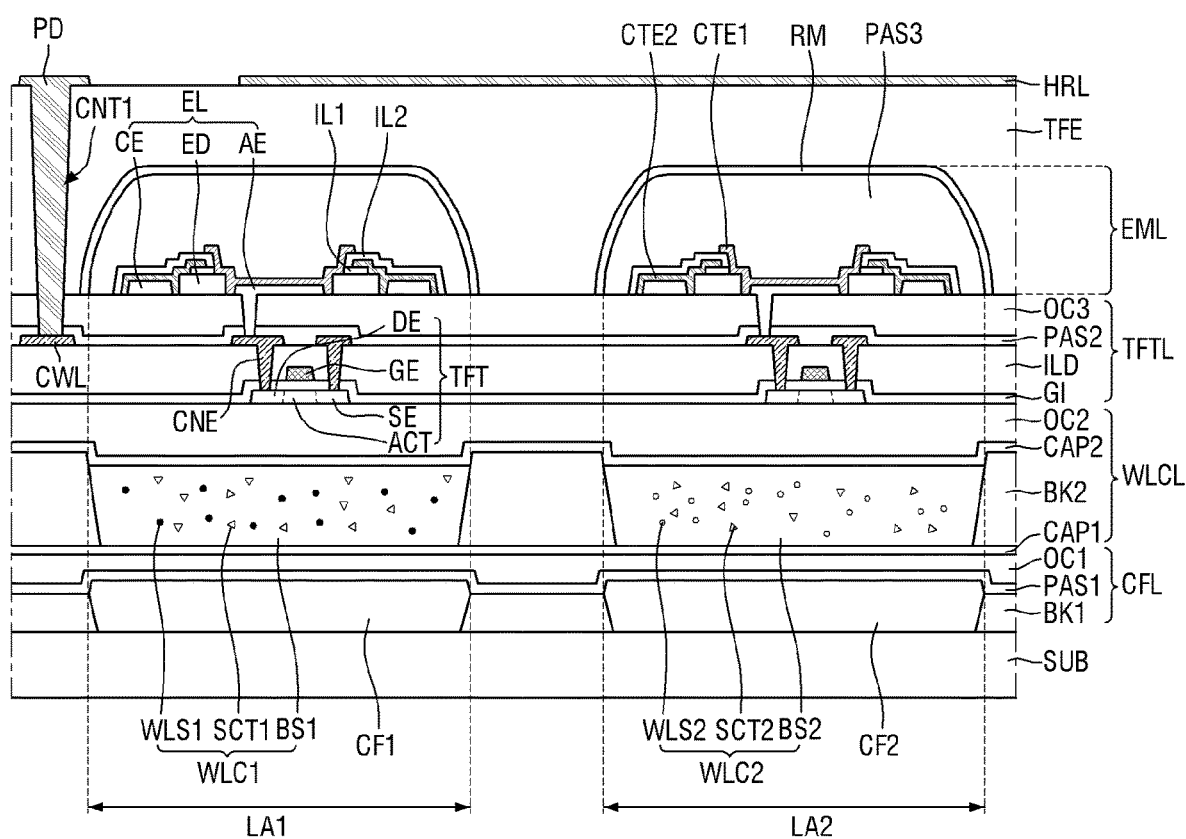

In FIG. 17, the pad portion PD may be disposed on the encapsulation layer TFE at the edge of the display device 10. The pad portion PD may be connected to the connection line CWL of the thin film transistor layer TFTL through a first contact hole CNT1 that penetrates the encapsulation layer TFE, the third planarization layer OC3, and the second passivation layer PAS2.

The pad portion PD may be disposed at the rear of the display device 10. For example, light emitted from the light emitting element layer EML may be reflected by the reflective member RM to be transmitted to the front of the display device 10 through the thin film transistor layer TFTL, the wavelength conversion layer WLCL, the color filter layer CFL, and the substrate SUB. Since the pad portion PD may be disposed at the rear of the display device 10, the size of the non-display area NDA of the display device 10 may be minimized. For example, the pad portion PD may be disposed in the non-display area NDA or the light blocking area BA of the display area DA. The pad portion PD may overlap the first light blocking member BK1 and the second light blocking member BK2. Accordingly, in the tiled display device TD, the gap between the display devices 10 may be minimized, thereby preventing the user from recognizing the boundary portions or the non-display areas NDA between the display devices 10.

The metal layer HRL may be disposed on the encapsulation layer TFE except for a region where the pad portion PD may be disposed. The metal layer HRL may be spaced apart and insulated from the pad portion PD. The metal layer HRL may discharge heat generated inside the display device 10 to the outside. The thermal conductivity of the metal layer HRL may be higher than that of the encapsulation layer TFE. In case of receiving heat generated in the light emitting element layer EML or the thin film transistor layer TFTL through the encapsulation layer TFE, the metal layer HRL may discharge the heat to outside of the display device 10.

The pad portion PD and the metal layer HRL may be made of the same material in the same layer. A material constituting the pad portion PD and the metal layer HRL may be coated on the encapsulation layer TFE and patterned to form the pad portion PD and the metal layer HRL. Accordingly, the display device 10 may reduce process steps, process time, and manufacturing cost.

Figure 18:
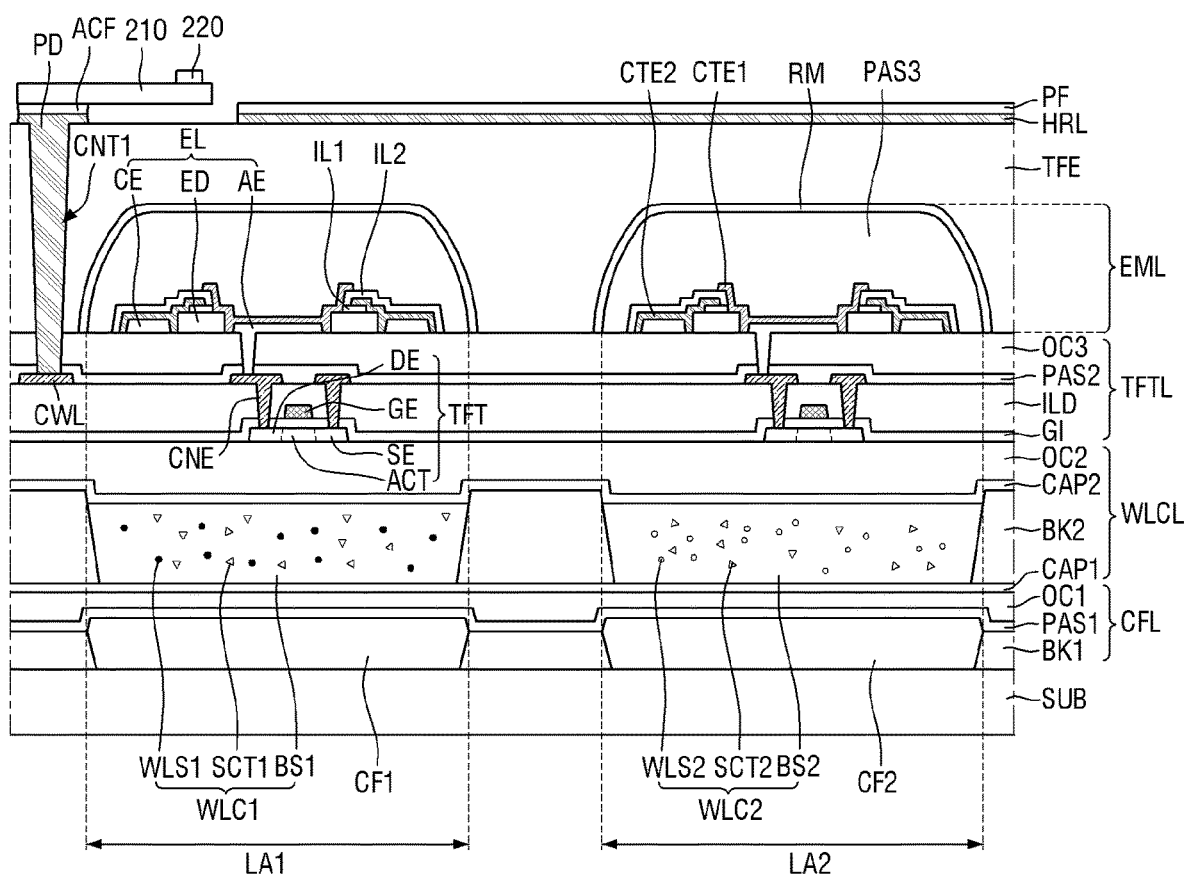

In FIG. 18, the flexible film 210 may be disposed on the pad portion PD. A side of the flexible film 210 may be connected to the pad electrode PD, and the other side of the flexible film 210 may be connected to a source circuit board (not shown). The flexible film 210 may transmit a signal from the source driver 220 to the display device 10. For example, the source driver 220 may be an integrated circuit (IC). In response to a source control signal of a timing controller, the source driver 220 may convert digital video data into an analog data voltage, and may supply it to a data line of the display area DA through the flexible film 210.

The protective film PF may be disposed on the metal layer HRL. The protective film PF may cover the metal layer HRL to prevent damage to the metal layer HRL.

As described above, in each of the display devices 10, the pad portion PD may be disposed at the rear of the display device 10, thereby minimizing the size of the non-display area NDA of the display device 10. For example, the pad portion PD may be disposed in the non-display area NDA or the light blocking area BA of the display area DA. The pad portion PD may overlap the first light blocking member BK1 and the second light blocking member BK2. Accordingly, in the tiled display device TD, the gap between the multiple display devices 10 may be minimized, thereby preventing the user from recognizing the boundary portions or the non-display areas NDA between the display devices 10.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
  a substrate including emission areas, and light blocking areas adjacent to the emission areas;
  a thin film transistor layer comprising:
    a thin film transistor disposed on the substrate; and
    a connection line electrically connected to the thin film transistor;
  a light emitting element layer disposed on the thin film transistor layer and comprising light emitting elements corresponding to the emission areas;
  an encapsulation layer overlapping the light emitting element layer;

a pad portion disposed on the encapsulation layer and in electrical contact with the connection line through a contact hole in the encapsulation layer; and
a flexible film disposed on the pad portion, electrically connected to the pad portion, and overlapping at least one of the emission areas.

2. The display device of claim 1, wherein
the thin film transistor layer comprises a connection electrode disposed on the thin film transistor to electrically connect a first electrode of the thin film transistor to the light emitting element, and
the connection line and the connection electrode are disposed on a same layer.

3. The display device of claim 1, wherein the connection line and a gate electrode of the thin film transistor are disposed on a same layer.

4. The display device of claim 1, wherein at least one of the pad portion and the connection line overlaps the light blocking areas.

5. The display device of claim 1, further comprising a metal layer disposed on the encapsulation layer and spaced apart from the pad portion.

6. The display device of claim 5, wherein the metal layer and the pad portion include a same material.

7. The display device of claim 6, further comprising a protective film overlapping the metal layer.

8. The display device of claim 1, wherein each of the light emitting elements comprises:
a first electrode disposed on the thin film transistor layer and electrically connected to the thin film transistor;
a second electrode disposed on the thin film transistor layer to be spaced apart from the first electrode; and
a light emitting diode disposed between the first electrode and the second electrode.

9. The display device of claim 8, wherein the light emitting element layer comprises:
a first contact electrode overlapping an end of the light emitting diode and the first electrode to electrically connect the light emitting diode to the first electrode; and
a second contact electrode overlapping another end of the light emitting diode and the second electrode to electrically connect the light emitting diode to the second electrode.

10. The display device of claim 9, wherein the light emitting element layer comprises:
a passivation layer overlapping the light emitting element, the first contact electrode, and the second contact electrode; and
reflective members overlapping the passivation layer and reflecting light emitted from the light emitting diode toward the substrate,
wherein the reflective members of each of the emission areas are spaced apart from each other.

11. The display device of claim 10, wherein the encapsulation layer overlaps top and side surfaces of each of the reflective members, and a portion of the thin film transistor layer.

12. The display device of claim 9, wherein the light emitting element layer comprises:
a passivation layer overlapping the light emitting element, the first contact electrode, and the second contact electrode; and
a reflective member overlapping the passivation layer and the thin film transistor layer, and reflecting light emitted from the light emitting diode toward the substrate.

13. A tiled display device comprising:
a plurality of display devices including a display area comprising pixels and a non-display area adjacent to the display area; and
a bonding member bonding the plurality of display devices, wherein
each of the plurality of display devices comprises:
a substrate including:
emission areas as a part of the display area; and
light blocking areas as another part of the display area, the light blocking areas adjacent to the emission areas;
a thin film transistor layer comprising:
a thin film transistor disposed on the substrate; and
a connection line electrically connected to the thin film transistor;
a light emitting element layer disposed on the thin film transistor layer and comprising light emitting elements corresponding to the emission areas;
an encapsulation layer overlapping the light emitting element layer;
a pad portion disposed on the encapsulation layer and in electrical contact with the connection line through a contact hole in the encapsulation layer; and
a flexible film disposed on the pad portion, electrically connected to the pad portion, and overlapping at least one of the emission areas.

14. The tiled display device of claim 13, wherein
the thin film transistor layer comprises a connection electrode disposed on the thin film transistor to electrically connect a first electrode of the thin film transistor to the light emitting element, and
the connection line and the connection electrode are disposed on a same layer.

15. The tiled display device of claim 13, wherein the connection line and a gate electrode of the thin film transistor are disposed on a same layer.

16. The tiled display device of claim 13, wherein at least one of the pad portion and the connection line overlaps at least one of the non-display area and the light blocking areas.

17. The tiled display device of claim 13, wherein each of the plurality of display devices comprises a metal layer disposed on the encapsulation layer and spaced apart from the pad portion.

18. The tiled display device of claim 17, wherein each of the plurality of display devices comprises
a protective film overlapping the metal layer.

19. The tiled display device of claim 13, wherein
each of the light emitting elements comprises:
a first electrode;
a second electrode spaced apart from the first electrode; and
a light emitting diode disposed between the first electrode and the second electrode, and
wherein the light emitting element layer comprises:
a first contact electrode electrically connecting the light emitting diode to the first electrode; and
a second contact electrode electrically connecting the light emitting diode to the second electrode.

20. The tiled display device of claim 19, wherein the light emitting element layer comprises:
a passivation layer overlapping the light emitting element, the first contact electrode, and the second contact electrode; and a reflective member overlapping the passivation layer and reflecting light emitted from the light emitting diode toward the substrate.

\* \* \* \* \*